(12) United States Patent
Maegawa et al.

(10) Patent No.: US 6,693,324 B2
(45) Date of Patent: *Feb. 17, 2004

(54) SEMICONDUCTOR DEVICE HAVING A THIN FILM TRANSISTOR AND MANUFACTURING METHOD THEREOF

(75) Inventors: Shigeto Maegawa; Takashi Ipposhi; Toshiaki Iwamatsu, all of Hyogo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/709,071

(22) Filed: Sep. 6, 1996

(65) Prior Publication Data

US 2003/0042542 A1 Mar. 6, 2003

(30) Foreign Application Priority Data

Apr. 26, 1996 (JP) .............................. 8-107294

(51) Int. Cl.[7] .............................................. H01L 27/01
(52) U.S. Cl. ...................... 257/347; 257/775; 257/412
(58) Field of Search ................................ 257/347, 773, 257/775, 65, 412, 413

(56) References Cited

U.S. PATENT DOCUMENTS 4,559,694 A * 12/1985 Yoh et al. ................... 257/412
4,584,026 A * 4/1986 Wu et al. .................... 257/607
4,774,197 A * 9/1988 Haddad et al. ............... 437/27

(List continued on next page.)

FOREIGN PATENT DOCUMENTS

| JP | 58-176930 | * 10/1983 |
| JP | 60-28223 | * 2/1985 |
| JP | 62-115860 | * 5/1987 |

(List continued on next page.)

OTHER PUBLICATIONS

"Impact of the Vertical SOI "Delta" Structure on Planar Device Technology", IEEE Transactions on Electron Devices, vol. 38, No. 6, Jun. 1991, pp. 1419–1424.*
"Improved Electrical Characteristics of Thin–Film Transistors Fabricated on Nitrogen–Implanted Polysilicon Films", C.K. Yang et al., IEEE 1994, pp. 505–508, Dec. 1994.*
"The Impact of Oxidation of Channel Polysilicon on the Trap–Density of Submicron Bottom–Gate TFT's", M. Sasaki et al., IEEE Transactions on Electron Device Letters, vol., 15 No. 1 Jan. 1994, pp. 1–3.*
"Modeling the Polysilicon Depletion Effect and its Impact on Submicrometer CMOS Circuit Performance"., N.D.Arora et al., IEEE Transactions on Electron Devices, vol. 42, May 1995, pp. 935–942.*

Primary Examiner—Amir Zarabian
Assistant Examiner—Kusha Rose
(74) Attorney, Agent, or Firm—McDermott, Will & Emery

(57) ABSTRACT

A semiconductor layer has one end placed on top of a first conductive layer and in contact with the first conductive layer, and the other end placed on top of a second conductive layer and in contact with the second conductive layer. At the central portion, the semiconductor layer faces a gate electrode layer with a gate insulating layer interposed therebetween. The semiconductor layer is formed so that its width $W_1$ is smaller than its height $H_1$. As a result, a thin film transistor and manufacturing method thereof can be obtained in which contact between a source/drain region of the thin film transistor and an upper or lower conductive layer can be made stably.

15 Claims, 31 Drawing Sheets

U.S. PATENT DOCUMENTS

| | | | | |
|---|---|---|---|---|
| 4,996,574 A | * | 2/1991 | Shirasahi | 257/66 |
| 5,365,109 A | * | 11/1994 | Ishida | 257/412 |
| 5,371,396 A | * | 12/1994 | Vinal et al. | 257/412 |
| 5,543,636 A | * | 8/1996 | Yamazaki | 257/66 |
| 5,550,397 A | * | 8/1996 | Lifshity et al. | 257/412 |
| 5,605,848 A | * | 2/1997 | Naaram | 438/287 |
| 5,614,732 A | * | 3/1997 | Yamazahi | 257/58 |
| 5,656,822 A | * | 8/1997 | Lee et al. | 257/347 |

FOREIGN PATENT DOCUMENTS

| | | | | |
|---|---|---|---|---|
| JP | 63-115361 | * | 5/1988 | |
| JP | 1-243572 | * | 9/1989 | |
| JP | 01308066 | | 12/1989 | |
| JP | 2-139929 | * | 5/1990 | |
| JP | 2-263473 | * | 10/1990 | |
| JP | 4-179166 | * | 6/1992 | |
| JP | 4-326767 | * | 11/1992 | |
| JP | 05226593 | | 9/1993 | |
| JP | 5-235353 | * | 9/1993 | 257/412 |
| JP | 6-61260 | * | 3/1994 | |
| JP | 06085278 | | 3/1994 | |
| JP | 06169083 | | 6/1994 | |
| JP | 7-183528 | * | 7/1995 | |
| JP | 08064832 | | 3/1996 | |

* cited by examiner

POSITION

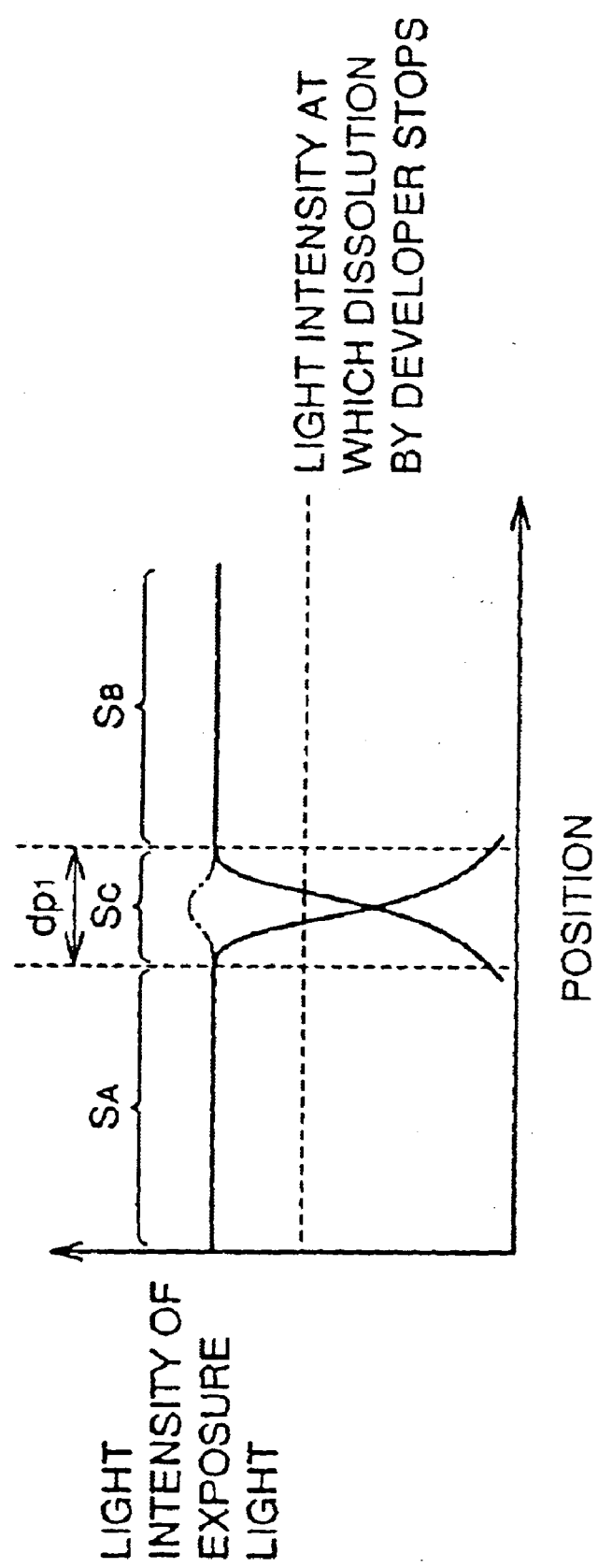

SEMICONDUCTOR DEVICE HAVING A THIN FILM TRANSISTOR AND MANUFACTURING METHOD THEREOF

BACKGROUND OF THE INVENTION

1. Field of the Invention

The present invention relates to semiconductor devices and manufacturing methods thereof and, more particularly, to a semiconductor device having a thin film transistor and a manufacturing method thereof.

2. Description of the Background Art

Conventionally, a thin film transistor with a so-called DELTA structure has been proposed as a thin film transistor. The thin film transistor with the DELTA structure is described, for example, by D. Hisamoto et al., in "Impact of the Vertical SOI 'DELTA' Structure on Planar Device Technology" *IEEE TRANSACTIONS ON ELECTRON DEVICES*, VOL. 38, No. 6, JUNE, 1991, pp. 1419–1424. Description will be made hereinafter of such thin film transistor with the DELTA structure as a conventional thin film transistor.

FIG. 48 is a perspective view schematically showing the structure of the conventional thin film transistor. Referring to FIG. 48, a monocrystalline silicon layer 203 is formed on a silicon substrate 220 with a field oxide film 221 interposed therebetween, thereby forming an SOI (Silicon On Insulator) structure. A pair of source/drain regions 203a and 203b are formed at monocrystalline silicon layer 203 so as to define a channel region. A gate electrode layer 207 is formed to face the channel region with a gate insulating film (not shown) interposed therebetween. Monocrystalline silicon layer 203 has a width $W_2$ of approximately 0.2 $\mu$m and a height $H_2$ of approximately 0.4 $\mu$m where width $W_2$ is set smaller than height $H_2$.

Next, description will be made of a method of manufacturing the conventional thin film transistor (FIG. 48).

FIGS. 49–52 are schematic cross-sectional views showing in order of the steps the method of manufacturing the conventional thin film transistor. Referring first to FIG. 49, a thermal oxide film (not shown) and a CVD nitride film 221 are deposited in this order on silicon substrate 220, and then CVD nitride film 221 and the thermal oxide film are patterned. Using CVD nitride film 221 and the oxide film thus patterned as a mask, silicon substrate 220 is subjected to anisotropic etching to form a silicon island 220a. Thereafter a thermal oxide film (not shown) is formed at a surface of silicon substrate 220 by thermal oxidation process. After the CVD nitride film is deposited at the entire surface, the entire surface of the silicon nitride film is etched back by anisotropic RIE (Reactive Ion Etching).

Referring to FIG. 50, a silicon nitride film 223 remains at a sidewall of silicon island 220a after etching back the entire surface. Then, silicon substrate 220 is isotropically etched using CVD nitride film 221 and sidewall nitride film 223 as a mask. Such isotropic etching removes a desired amount of the surface of substrate 220 exposed from nitride films 221 and 223. The substrate is then subjected to long-time thermal oxidation process at a high temperature of, for example, 1100° C.

Referring to FIG. 51, through such thermal oxidation process a field oxide film 211 is formed on silicon substrate 220 and monocrystalline silicon layer 203 is formed on field oxide film 211, and then CVD nitride film 221 and sidewall nitride film 223 are removed. A sacrifice oxide layer is once formed at a surface of monocrystalline silicon layer 203 through thermal oxidation process in order to remove damage on the surface of monocrystalline layer 203, and this sacrifice oxide layer is then removed by hydrofluoric acid or the like.

Referring to FIG. 48, after a gate insulating layer is formed a gate electrode layer 207 is formed to face a region of monocrystalline silicon layer 203 to serve as a channel with the gate insulating layer interposed therebetween. Impurities are introduced using gate electrode layer 207 and the like as a mask to form source/drain regions 203a and 203b at monocrystalline silicon layer 203, thereby completing a thin film transistor with the DELTA structure.

Thus, since monocrystalline silicon layer 203 serving as a channel has width $W_2$ smaller than height $H_2$ and is covered with gate electrode 207 on both sides in the conventional thin film transistor, the transistor has great current drivability and its characteristics is less degraded by reduction in length of the channel. In addition, gate electrode 207 covers both side surfaces and an upper surface of monocrystalline silicon layer 203 and width $W_2$ of a lower surface is small, so that the region serving as a channel is covered with gate electrode layer 207 for the most part. As a result, the conventional thin film transistor can also prevent electric effects imposed by external electrode interconnections. Therefore, the conventional thin film transistor is extremely advantageous for use as a transistor surrounded by many interconnections such as a load transistor forming a memory cell of an SRAM (Static Random Access Memory).

However, since monocrystalline silicon layer 203 has a small width $W_2$, the conventional thin film transistor cannot make a contact with another conductive layer in a stable manner. This problem will be described in detail below.

FIG. 52 shows an example of the structure of the thin film transistor connected to an upper conductive layer. Referring to FIG. 52, an upper conductive layer 218 is connected to the portion of monocrystalline silicon layer 203 to serve as a source/drain region through a contact hole 217a provided in an interlayer insulating layer 217. Contact hole 217a is generally formed by etching interlayer insulating layer 217 using a resist pattern 219 formed on interlayer insulating layer 217 as a mask as shown in FIG. 53. However, a hole pattern 219a of resist pattern 219 may be shifted in the direction of X shown in the figure due to overlay displacement of the mask or the like during photolithography for forming resist pattern 219.

Since monocrystalline silicon layer 203 has width $W_2$ as small as 0.2 $\mu$m, contact hole 217a is easily shifted away from monocrystalline silicon layer 203 as shown in FIG. 54. Consequently, a contact between upper conductive layer 218 and monocrystalline silicon layer 203 cannot be made.

Furthermore, the conventional method of manufacturing a thin film transistor requires long-time thermal oxidation process at a high temperature for forming an SOI structure. If such long-time thermal oxidation process at a high temperature is carried out after other elements are formed, they may be destroyed by diffusion of impurities or the like. Therefore, such high temperature, long-time thermal oxidation process must be carried out before other elements are formed. As a result, there is another problem that this thin film transistor cannot be formed over other elements formed on silicon substrate 220.

SUMMARY OF THE INVENTION

One object of the present invention is to provide a thin film transistor that allows a contact between a source/drain region of a thin film transistor and an upper or lower conductive layer to be made stably.

Another object of the present invention is to provide a method of manufacturing a thin film transistor allowing a thin film transistor to be formed over an element formed at a substrate.

A semiconductor device having a thin film transistor according to one aspect of the present invention includes first and second conductive layers, a semiconductor layer, and a gate electrode layer. The first and second conductive layers are formed isolated from each other. The semiconductor layer has one end placed on top of the first conductive layer and in contact with the first conductive layer and the other end placed on top of the second conductive layer and in contact therewith. The gate electrode layer covers an upper surface and opposing side surfaces of the semiconductor layer, with a gate insulating layer interposed therebetween, at a central portion sandwiched by one and the other ends of the semiconductor layer. The line width defined by the opposing side surfaces of the semiconductor layer is smaller than the thickness of the semiconductor layer. The first and second conductive layers each have a line width greater than that of the semiconductor layer.

In the semiconductor device having a thin film transistor according to the aspect above, the first and second conductive layers are formed in contact with one and the other ends of the semiconductor layer, respectively, and have a width greater than that of the semiconductor layer. As a result, even if the position where the contact hole to be in contact with one and the other ends of the semiconductor layer is shifted due to overlay displacement of the mask, a contact with the first and second conductive layers can be made more stably.

In the aspect above, the gate electrode layer preferably covers a lower surface of the semiconductor layer.

In the aspect above, the gate electrode layer preferably covers the surface of the semiconductor layer from the upper end to the lower end thereof at the central portion of the semiconductor layer.

In the two preferable aspects above, a thin film transistor with excellent gate electrode controllability can be obtained.

In the aspect above, preferably, nitrogen is introduced at least to a portion of the semiconductor layer covered with the gate electrode, and one kind of impurity selected from the group consisting of fluorine, oxygen and neon is introduced at least to the gate insulating layer and the portion of the semiconductor layer covered with the gate electrode.

As a result, a current flowing between the drain and the source when the thin film transistor is off (this current will be hereinafter referred to as an off-current) can be reduced while maintaining a threshold voltage of the thin film transistor at an appropriate value.

In the aspect above, the gate insulating film preferably includes silicon oxynitride ($SiO_xN_{1-x}$). Consequently, an off-current can be reduced and increase in threshold voltage of the thin film transistor can be prevented.

In the aspect above, preferably nitrogen is introduced to the gate insulating film and to the surface of the gate electrode layer facing the semiconductor layer.

Consequently, an off-current can be reduced and increase in threshold voltage of the thin film transistor can be prevented.

In the aspect above, preferably impurities of the conductivity types different from each other are introduced to the first and second conductive layers and the gate electrode layer, and the concentration of the impurity introduced to the gate electrode layer is $4.23 \times 10^{19}$ cm$^{-3}$ or lower.

Consequently, a current flowing between the drain and the source when the thin film transistor is on (this current will be hereinafter referred to as a on-current) can be increased while an off-current is decreased.

In the aspect above, preferably the semiconductor layer and the first and second conductive layers include impurities of the same conductivity type, and the impurities introduced to one and the other ends have concentration lower than that of the impurities introduced to the first and second conductive layers.

Consequently, one and the other ends of the semiconductor layer can be formed as regions with relatively low impurity concentration and the first and second conductive layers as regions with relatively high impurity concentration, thereby implementing a so-called LDD (Lightly Doped Drain) structure and relaxing the drain electric field.

A semiconductor device having a thin film transistor according to another aspect of the present invention includes a semiconductor layer and a gate electrode layer. The semiconductor layer has a pair of source/drain regions spaced apart from each other to define a channel region. The gate electrode layer faces the channel region of the semiconductor layer with a gate insulating layer interposed therebetween. Nitrogen is introduced to the channel region and one kind of impurity selected from the group consisting of fluorine, oxygen and neon is introduced to the channel region and the gate insulating layer.

Introduction of nitrogen contributes to inactivation of crystal defect which is present in a high electric field region of the contact portion between the drain and the channel (this portion will be hereinafter referred to as a drain end), thereby reducing an off-current of the thin film transistor. Negative fixed charges are formed by introduction of fluorine or the like to the gate insulating layer, thereby canceling change in threshold voltage in the negative direction due to donor effect of nitrogen. As a result, an off-current can be reduced while maintaining the threshold voltage of the thin film transistor at an appropriate value.

A semiconductor device having a thin film transistor according to still another aspect of the present invention includes a semiconductor layer and a gate electrode layer. The semiconductor layer has a pair of source/drain regions spaced apart from each other to define a channel region. The gate electrode layer faces the channel region of the semiconductor layer with a gate insulating layer interposed therebetween. Nitrogen is introduced to the gate insulating layer and the surface of the gate electrode layer facing the channel region.

Consequently, oxidation of the surface of the gate electrode layer facing the gate insulating layer can be prevented, an off-current of the thin film transistor can be reduced, and increase in threshold voltage can also be prevented.

A semiconductor device having a thin film transistor according to a further aspect of the present invention includes a semiconductor layer and a gate electrode layer. The semiconductor layer has a pair of source/drain regions spaced apart from each other to define a channel region. The gate electrode layer faces the channel region of the semiconductor layer with a gate insulating layer interposed therebetween. The source/drain regions of the semiconductor layer and the gate electrode layer have impurities of the same conductivity type introduced thereto. The impurity introduced to the gate electrode layer has a concentration of $4.23 \times 10^{19}$ cm$^{-3}$ or lower.

Consequently, a high on-current can be obtained because the gate capacitance is determined only by the capacitance of the gate insulating layer when the thin film transistor is on. In addition, a low off-current can be obtained because a depletion layer is produced at the surface of the gate electrode layer facing the channel to reduce the gate capacitance when the transistor is off.

A method of manufacturing a semiconductor device having a thin film transistor according to one aspect of the present invention includes the following steps.

First and second conductive layers are formed by vapor deposition to be isolated from each other. A layer formed by vapor deposition is etched to form a semiconductor layer having one end placed on top of the first conductive layer and in contact with the first conductive layer and the other end placed on top of and in contact with the second conductive layer. At a central portion sandwiched by one and the other ends of the semiconductor layer, a gate electrode layer is formed by vapor deposition which covers an upper surface and opposing side surfaces of the semiconductor layer with a gate insulating layer interposed therebetween. The first and second conductive layers and the semiconductor layer are formed so that the line width defined by the opposing side surfaces of the semiconductor layer is smaller than the thickness of the semiconductor layer and the line width of the first and second conductive layers is greater than that of the semiconductor layer.

In the method of manufacturing a semiconductor device having a thin film transistor according to the one aspect of the present invention, respective portions forming the thin film transistor are formed by vapor deposition method. This eliminates the need for the high temperature, long time thermal processing for fabricating an SOI structure in contrast to the conventional art, so that this thin film transistor can be formed over an element at the substrate. As a result, a thin film transistor more suitable for high integration can be obtained.

A method of manufacturing a semiconductor device having a thin film transistor according to another aspect of the present invention includes the following steps.

First, a semiconductor layer is formed. Photoresist is applied to cover the semiconductor layer. The photoresist is exposed to the light transmitted through a reticle with a pattern for patterning the semiconductor layer so that the semiconductor layer has a pair of regions to serve as source/drain regions to define a channel region thereby to demagnify the pattern by n, and the photoresist is developed to form a resist pattern. There is a space equal to the minimum exposure size x n between the region to serve as a drain region and the channel region of the pattern. The semiconductor layer is etched using the resist pattern as a mask, thereby patterning the semiconductor layer so that the layer has a pair of regions to serve as source/drain regions to define the channel region and the line width at the junction portion between the channel region and the region to serve as a drain region is smaller than the line width of the remaining portions. Impurities are introduced to the pair of regions to serve as source/drain regions of the semiconductor layer to form a pair of source/drain regions. The gate electrode layer is formed to face the channel region with a gate insulating layer interposed therebetween.

According to the method of manufacturing a semiconductor device having a thin film transistor according to the above-mentioned another aspect of the present invention, a thin film transistor having a low off-current can be easily manufactured.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 32 is a diagram for describing that channel polysilicon with its drain end having the line width smaller than that of the remaining portions can be formed.

DESCRIPTION OF THE PREFERRED EMBODIMENTS

Now, embodiments of the present invention will be described with reference to the drawings.
Embodiment 1

Figure 1:
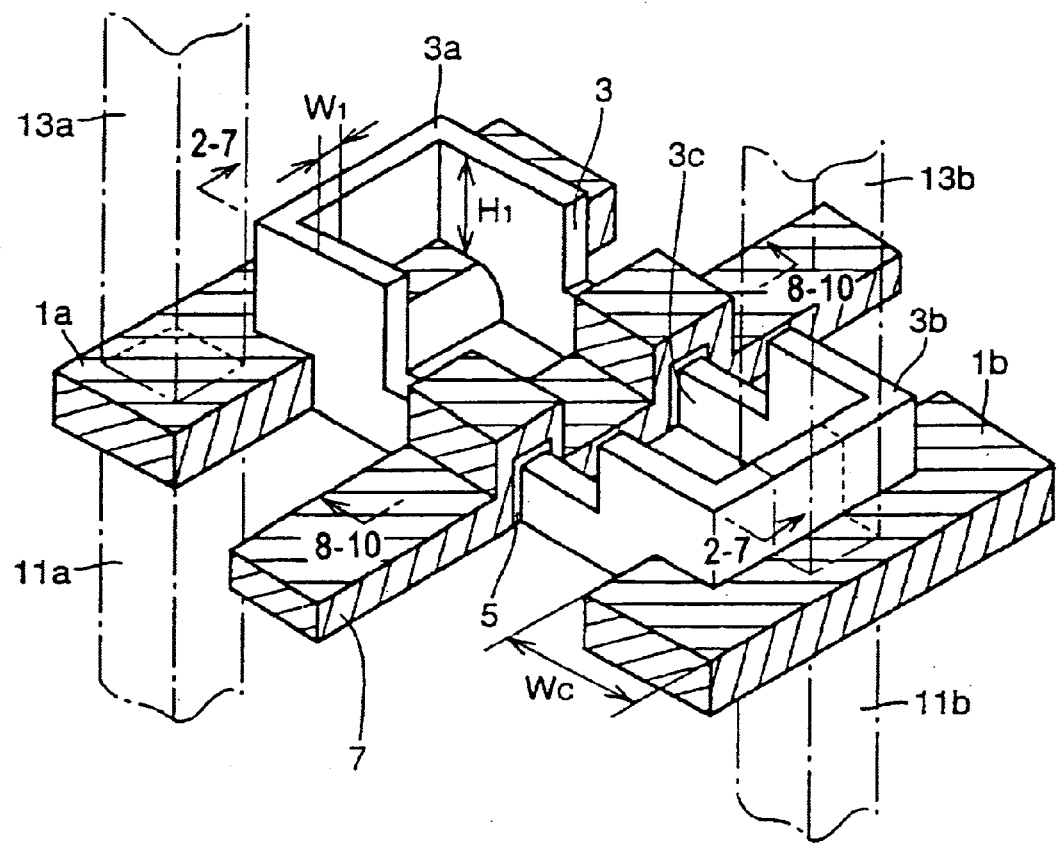
FIG. 1 is a perspective view schematically showing the structure of a thin film transistor according to a first embodiment of the present invention.

Referring to FIG. 1, a thin film transistor according to the present embodiment has first and second conductive layers 1a and 1b, a semiconductor layer 3, a gate insulating layer 5, and a gate electrode 7.

First and second conductive layers 1a and 1b are formed of the same layer to be isolated from each other. Semiconductor layer 3 is formed so that its one end portion 3a is placed on top of first conductive layer 1a and in contact with layer 1a and the other end portion 3b is placed on top of second conductive layer 1b and in contact with second conductive layer 1b. Gate electrode layer 7 is formed to extend over and face the central portion sandwiched by one end 3a and the other end 3b of semiconductor layer 3 with gate insulating layer 5 interposed therebetween. Gate electrode layer 7 is formed to cover opposing side surfaces and an upper surface of semiconductor layer 3.

Semiconductor layer 3 is formed so that its width $W_1$ defined by the side surfaces is smaller than its height (thickness) $H_1$. For example, semiconductor layer 3 has width $W_1$ of 100 nm or smaller and height $H_1$ of 200 nm or smaller.

First and second conductive layers 1a and 1b have a line width $W_C$ of 0.3 μm to 1.0 μm. If line width $W_C$ is smaller than 0.3 μm, contact with first and second conductive layers 1a and 1b cannot be made stably when contact holes 11a, 11b, 13a and 13b are formed shifted due to overlay displacement. In addition, if line width $W_C$ exceeds 1.0 μm, the plane area occupied by the thin film transistor is increased, which is not suitable for high integration.

The thin film transistor is formed over other elements formed at, for example, the silicon substrate. Contact holes 11a and 11b are provided to electrically connect first and second conductive layers 1a and 1b with the lower elements. Contact holes 13a and 13b are provided to electrically connect first and second conductive layers 1a and 1b with the upper elements.

Particularly, contact holes 13a and 13b may be formed to expose both semiconductor layer 3 and first or second conductive layer 1a or 1b, or may be provided to expose only the first or second conductive layer 1a or 1b.

Here, when p type impurities are introduced to semiconductor layer 3 and n type impurities are introduced to first and second conductive layers 1a and 1b, first and second conductive layers 1a and 1b function as source/drain regions and this thin film transistor serves as an n channel transistor. When impurities of the conductivity types opposite to those described above are introduced, the transistor functions as a p channel transistor.

If one and the other ends 3a and 3b of semiconductor layer 3 are of the conductivity type different from that of the central portion serving as a channel and same as that of first and second conductive layers 1a and 1b, they form a part of the source/drain regions of the thin film transistor. When one and the other ends 3a and 3b of semiconductor layer 3 form a part of the source/drain regions of the thin film transistor and have an impurity concentration lower than that of first and second conductive layers 1a and 1b, a so-called LDD structure is formed by one and the other ends 3a and 3b and first and second conductive layers 1a and 1b. Formation of such LDD structure contributes to relaxation of the drain electric field.

First and second conductive layers 1a and 1b, semiconductor layer 3a and gate electrode layer 7 are formed by, for example, vapor deposition and made of polycrystalline silicon with introduced impurities (hereinafter referred to as doped polysilicon). Gate insulating layer 5 is made of a silicon oxide film formed by, for example, vapor deposition.

Now, a method of manufacturing the thin film transistor according to the present embodiment will be described.

Figure 12:
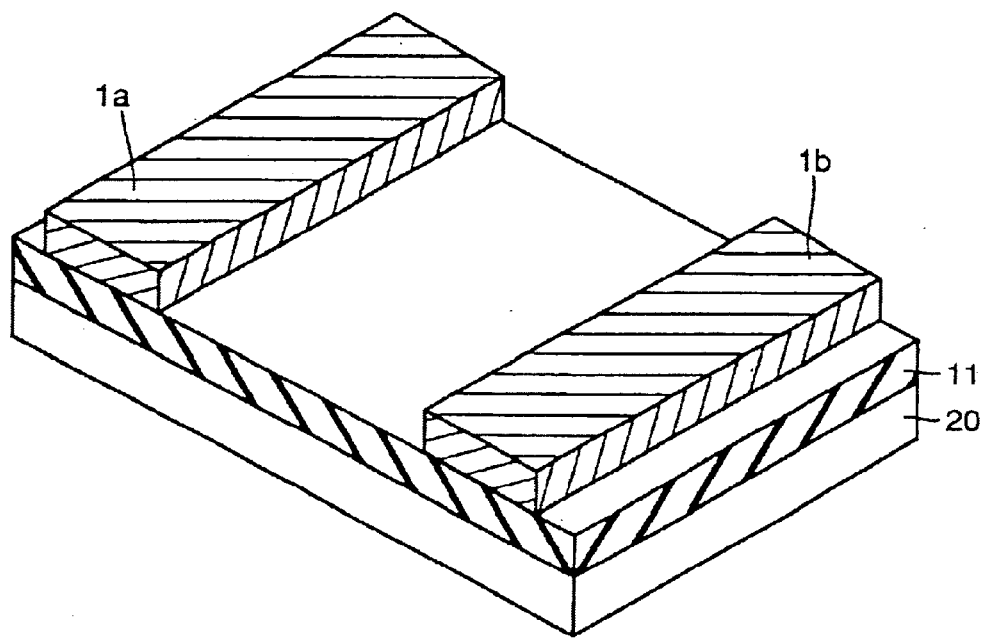
FIGS. 12–14 are schematic perspective views showing the first-third steps, respectively, of the method of manufacturing a thin film transistor according to the first embodiment of the present invention.
Figure 15:
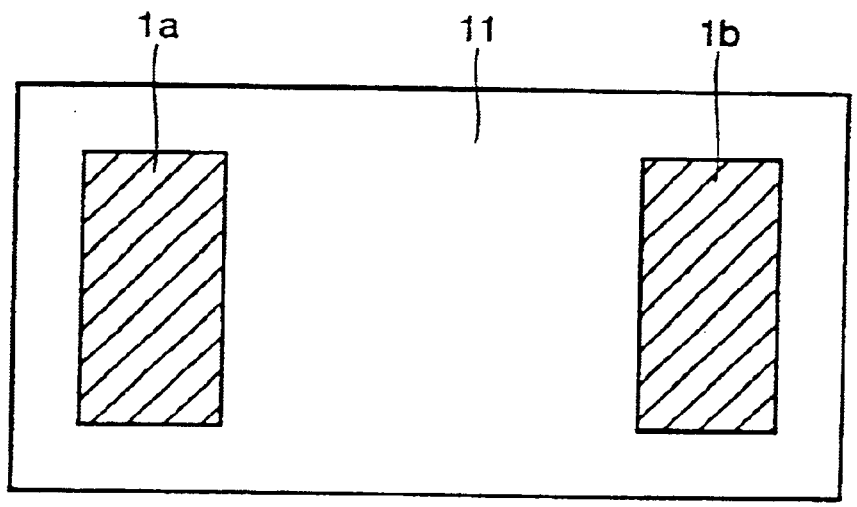
FIGS. 15–19 are schematic plan views showing the first-sixth steps of the method of manufacturing a thin film transistor according to the first embodiment of the present invention.

Referring to FIGS. 12 and 15, an interlayer insulating layer 11 of a silicon oxide film is formed at a surface of a silicon substrate 20 by CVD (Chemical Vapor Deposition) to have a thickness of, for example, 0.2 μm. On interlayer insulating film 11, a doped polysilicon film having, for example, phosphorus added thereto is formed at the entire surface by CVD to have a thickness of 0.1 μm. Using conventional photolithography and etching technique, the doped polysilicon film is patterned to form first and second conductive layers 1a and 1b.

Figure 2:
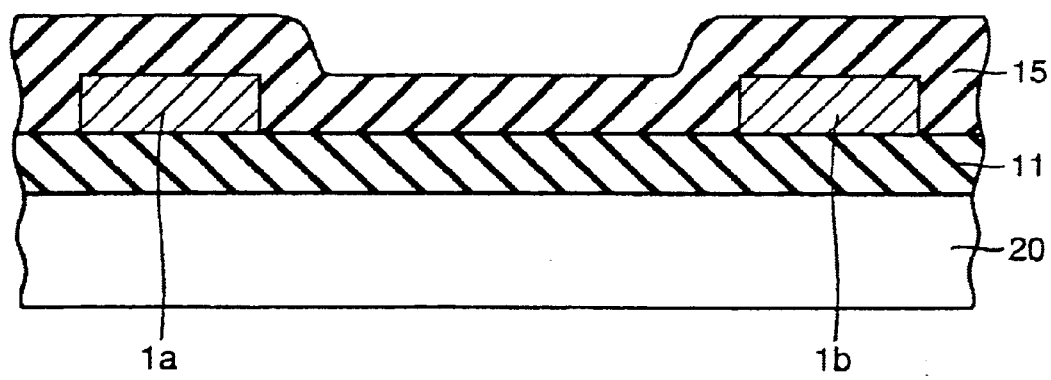
FIGS. 2–7 are schematic cross sectional views taken along the line A—A in FIG. 1, showing-first-sixth steps, respectively, of a method of manufacturing a thin film transistor according to the first embodiment of the present invention.

Referring now to FIG. 2, a silicon nitride film 15 having a thickness of 0.1 μm is formed at the entire surface by, for example, CVD to cover first and second conductive layers 1a and 1b.

Figure 13:
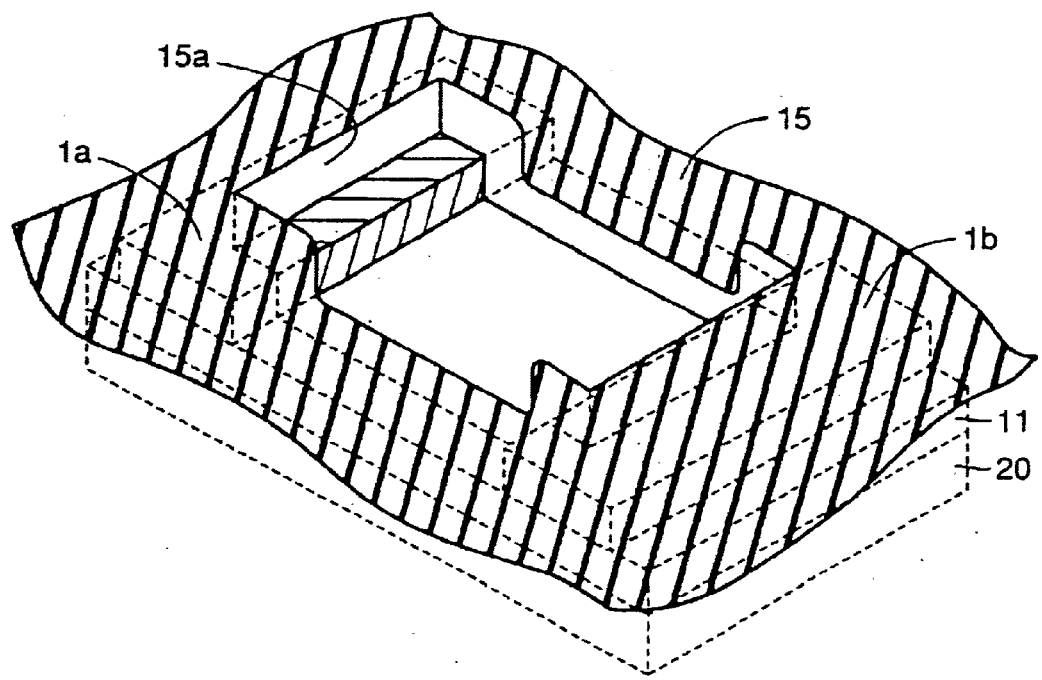
Figure 14:
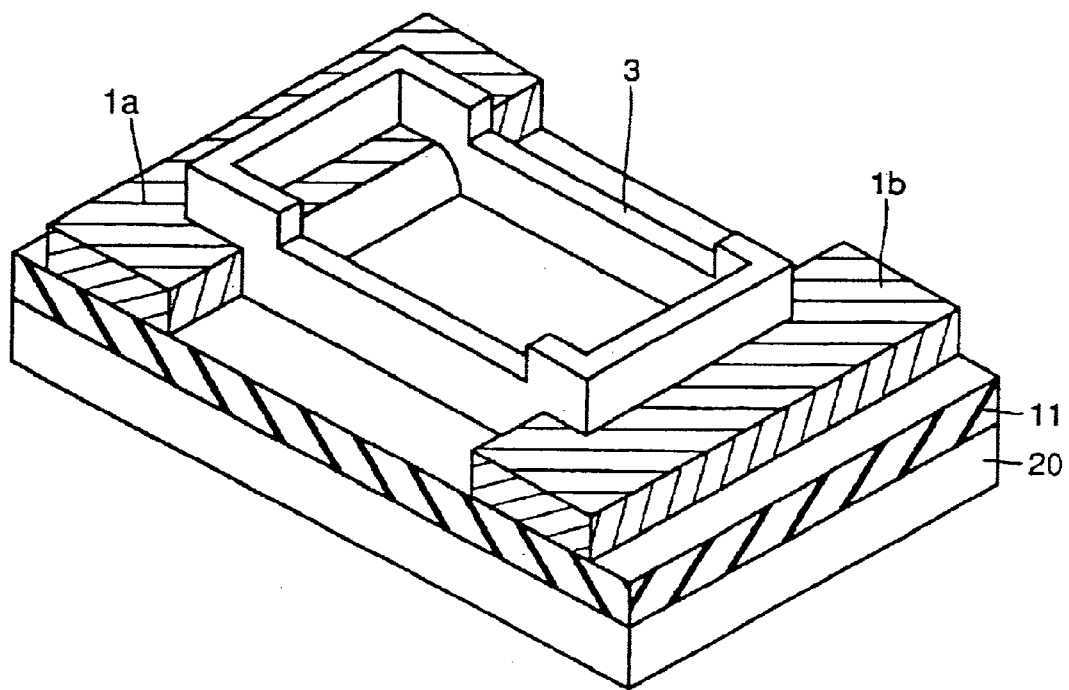
Figure 16:
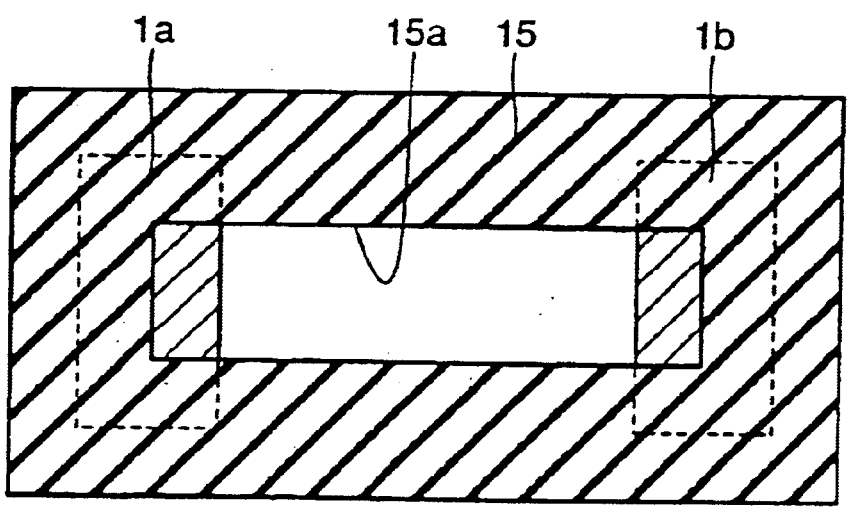

Referring to FIGS. 13 and 16, a rectangular hole 15a is formed at silicon nitride film 15 employing conventional photolithography and etching technique. Rectangular hole 15a exposes a part of first and second conductive layers 1a and 1b.

Figure 3:
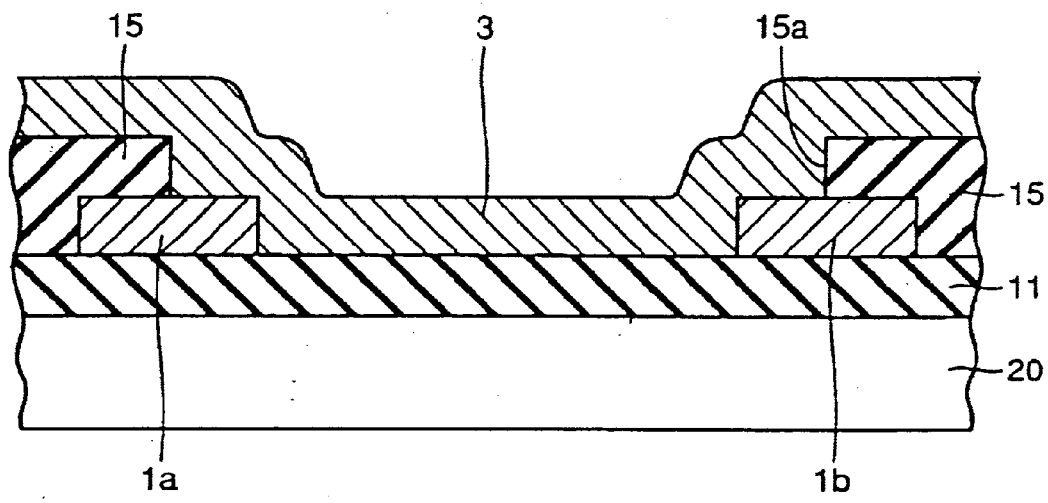
Figure 8:
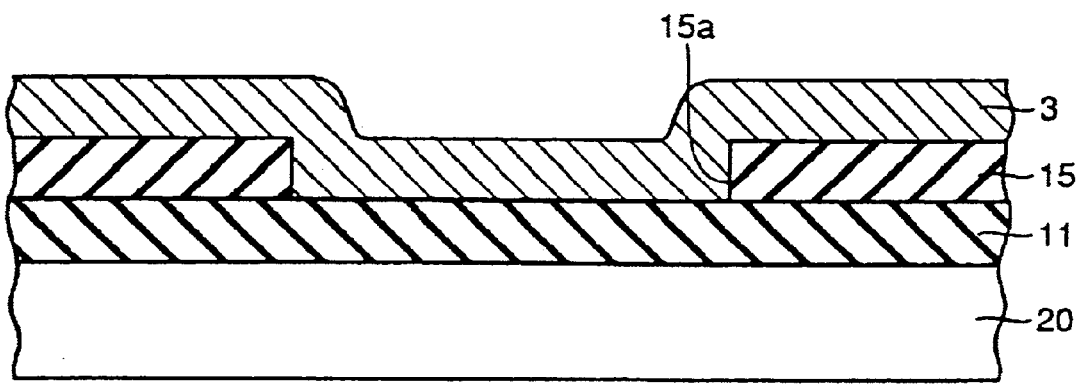
FIGS. 8–10 are schematic cross sectional views taken along the line B—B in FIG. 1, showing the first-third steps, respectively, of the method of manufacturing a thin film transistor according to the first embodiment of the present invention.

Referring to FIGS. 3 and 8, polycrystalline (poly) silicon film 3 is formed to have a thickness of 0.05 μm by, for example, CVD at the entire surface to fill in rectangular hole 15a. The entire surface of polysilicon film 3 is subjected to anisotropic dry etching, thereby removing polysilicon film 3 by the amount corresponding to its thickness.

Figure 4:
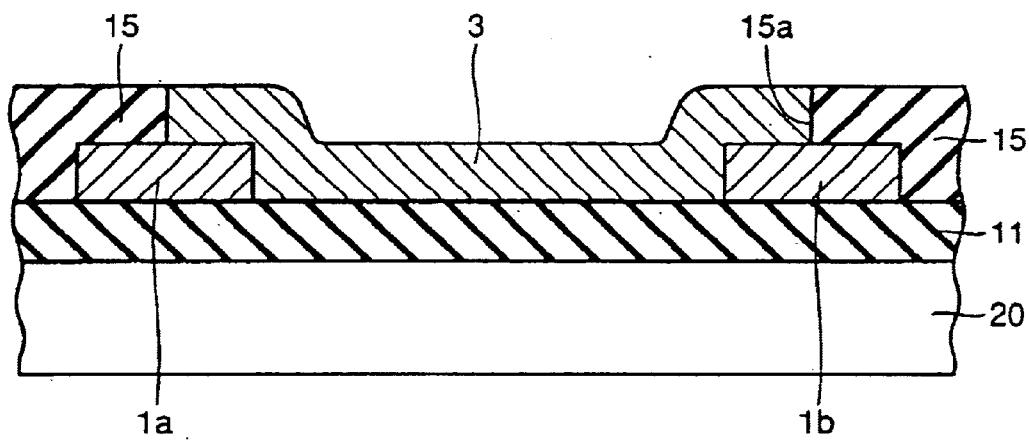
Figure 5:
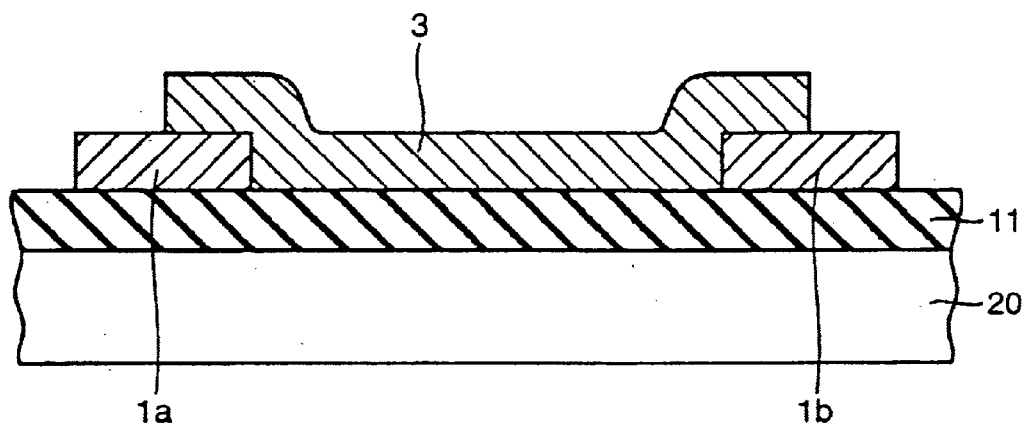
Figure 9:
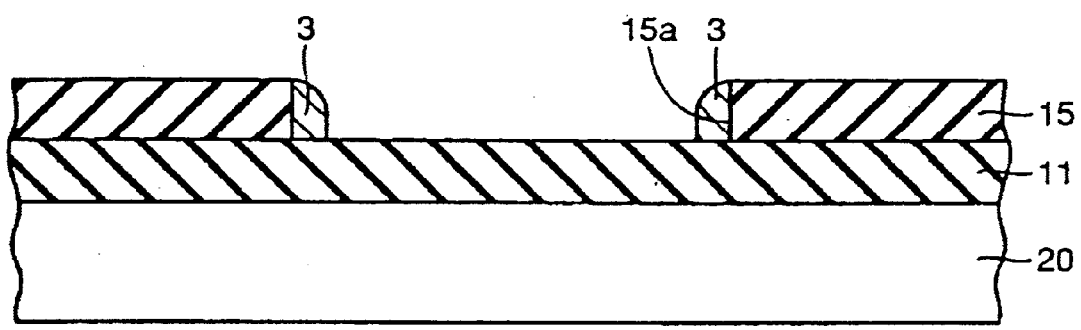
Figure 17:
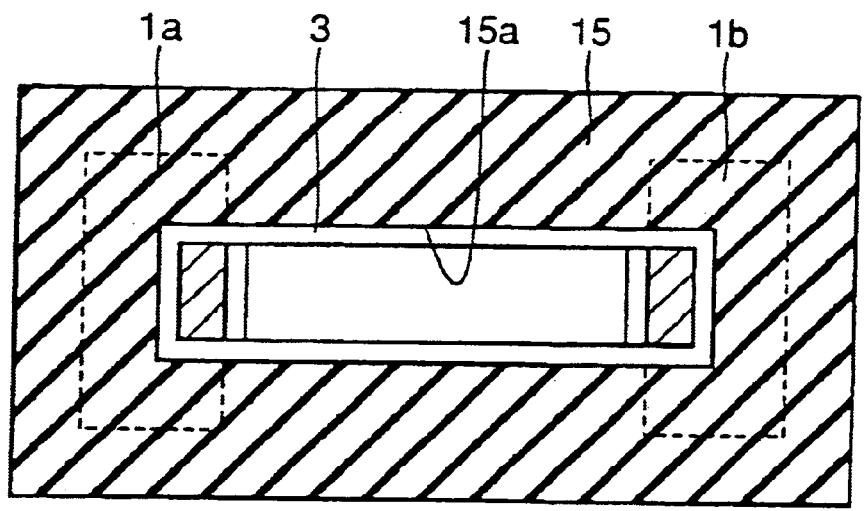
Figure 18:
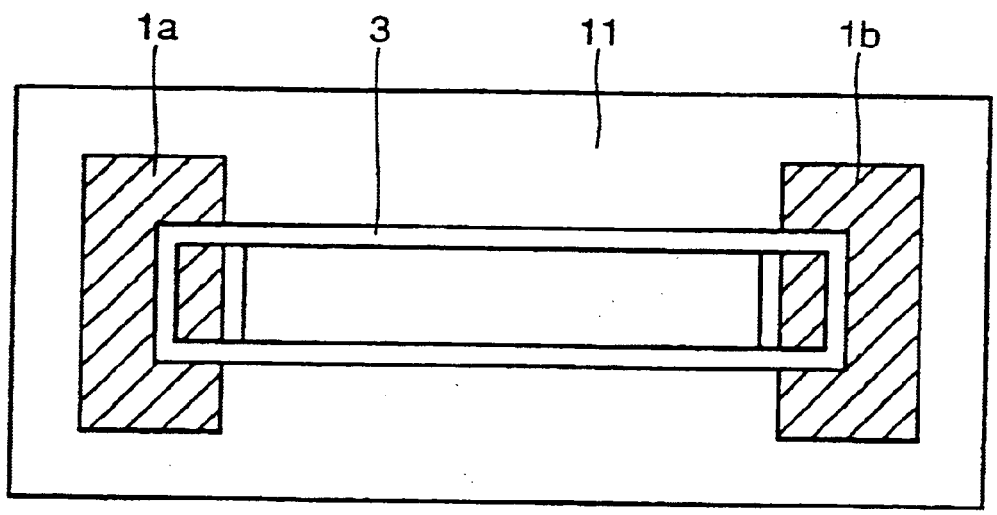

Referring to FIGS. 4, 9, and 17, such anisotropic etching leaves polysilicon film 3 along the inner walls of rectangular hole 15a and sidewalls of first and second conductive layers 1a and 1b. At this point in time, polysilicon film 3 has a width of 0.05 μm and a height of 0.1 μm. This thin film transistor 3 is electrically connected to first and second conductive layers 1a and 1b. Thereafter, silicon nitride film 15 is all removed by hot solution of phosphoric acid.

Referring to FIGS. 5, 10, 14 and 18, as a result of such removal of the silicon nitride film, pattern 3 of the polysilicon having a channel region of the thin film transistor (channel polysilicon) is left. This is because channel polysilicon pattern 3 and interlayer insulating layer 11 formed of a silicon oxide film are not eroded by phosphoric acid.

Figure 6:
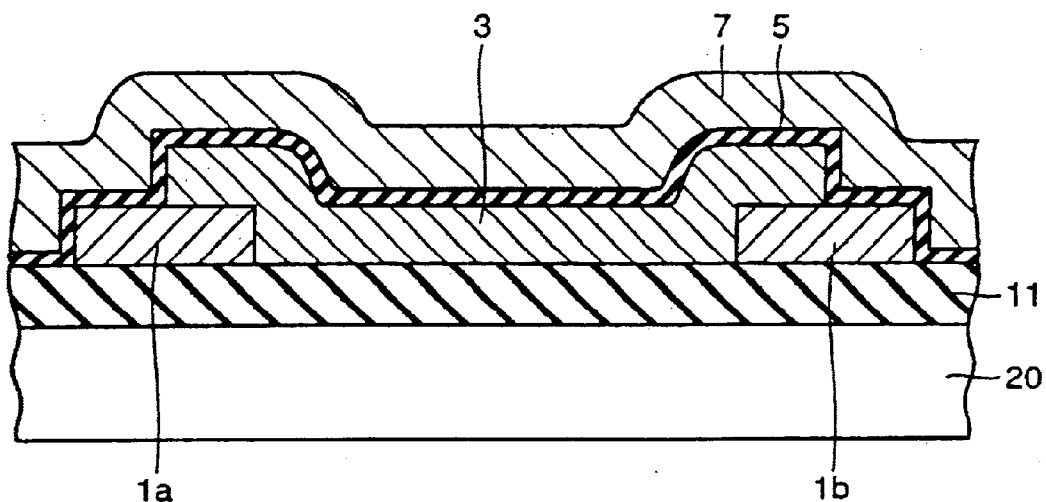
Figure 7:
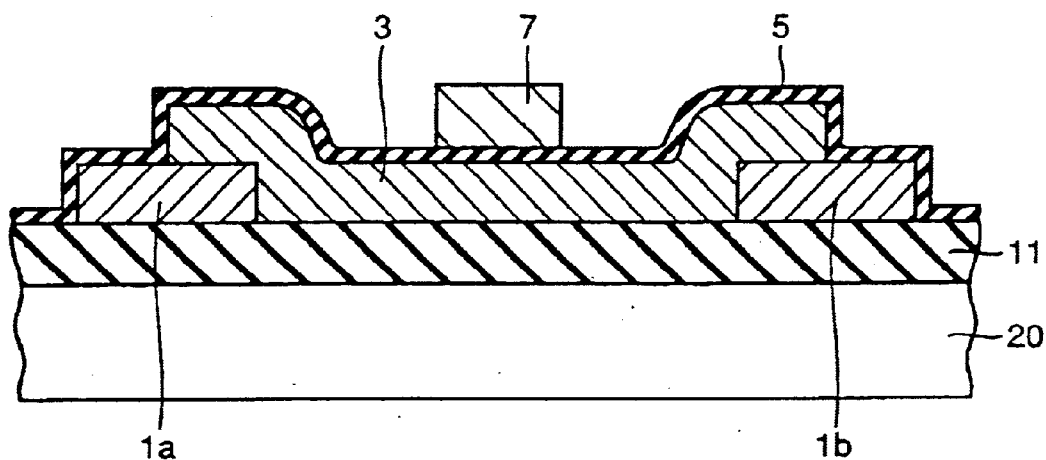
Figure 11:
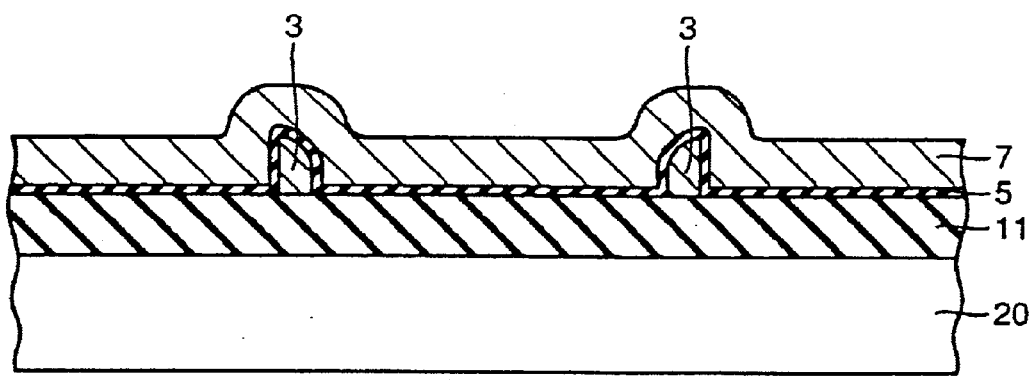
FIG. 11 is a schematic cross sectional view taken along the line B—B in FIG. 1 showing the method of manufacturing a thin film transistor according to the first embodiment of the present invention.
Figure 19:
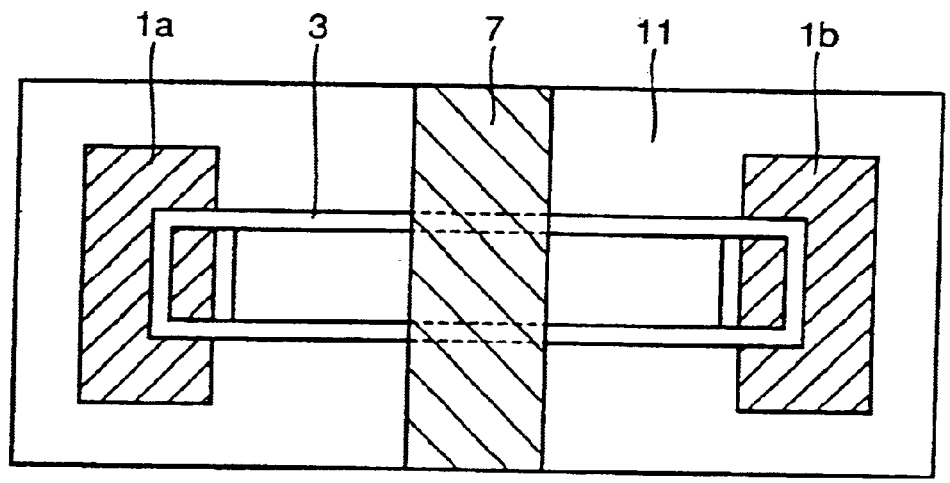

Referring to FIGS. 6 and 11, silicon oxide film 5 serving as a gate insulating film is formed to have a thickness of 0.02 μm by, for example, CVD covering first and second conductive layers 1a and 1b and channel polysilicon pattern 3. A phosphorus-doped polysilicon film 7 is deposited to have a thickness of 0.1 μm by, for example, CVD. Doped polysilicon film 7 and silicon oxide film 5 are patterned using conventional photolithography and etching technique, thereby completing a thin film transistor of the present embodiment shown in FIGS. 1, 7 and 19.

While silicon nitride film 15 is employed for defining the frame of channel polysilicon pattern 3, the material is not limited to silicon nitride. Any material can be used for this film as long as it has etch selectivity to the silicon oxide film and polysilicon.

In the thin film transistor of the present embodiment, first and second conductive layers 1a and 1b have width $W_C$ greater than width $W_1$ of semiconductor layer 3a as shown in FIG. 1. Therefore, even if contact holes 11a, 11b, 13a and 13b are formed shifted due to overlay displacement of the mask, contact with first and second conductive layers 1a and 1b can be made in a stable manner.

In the method of manufacturing a thin film transistor according to the present embodiment, the component forming each portion of the thin film transistor is formed by vapor deposition method such as CVD. This method eliminates the need for the high temperature, long time thermal processing which is required for forming an SOI structure, so that this thin film transistor can be easily formed over other elements.

Figure 48:
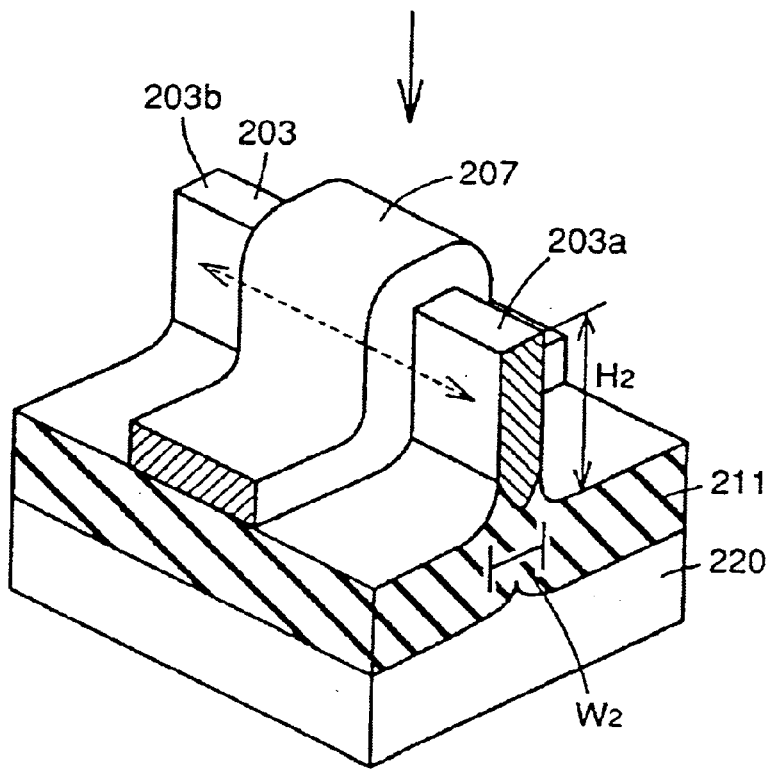
FIG. 48 is a perspective view schematically showing the structure of a conventional thin film transistor.
Figure 49:
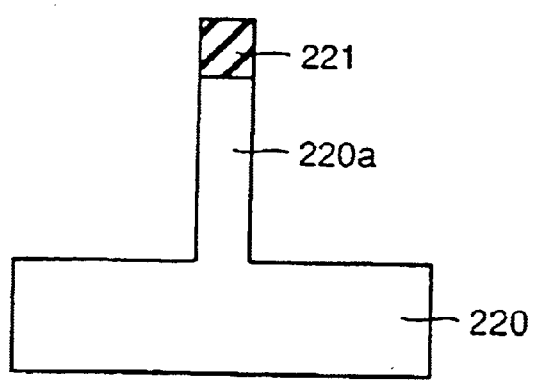
FIGS. 49–51 are schematic cross sectional views showing the first-third steps of a method of manufacturing the conventional thin film transistor.
Figure 50:
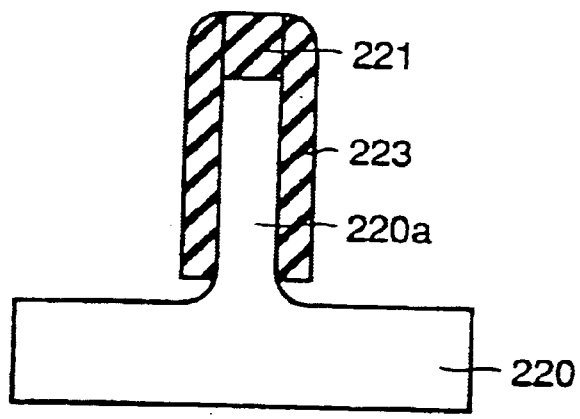
Figure 51:
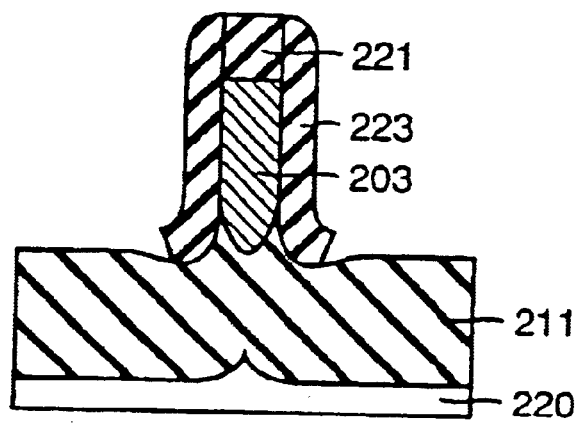
Figure 52:
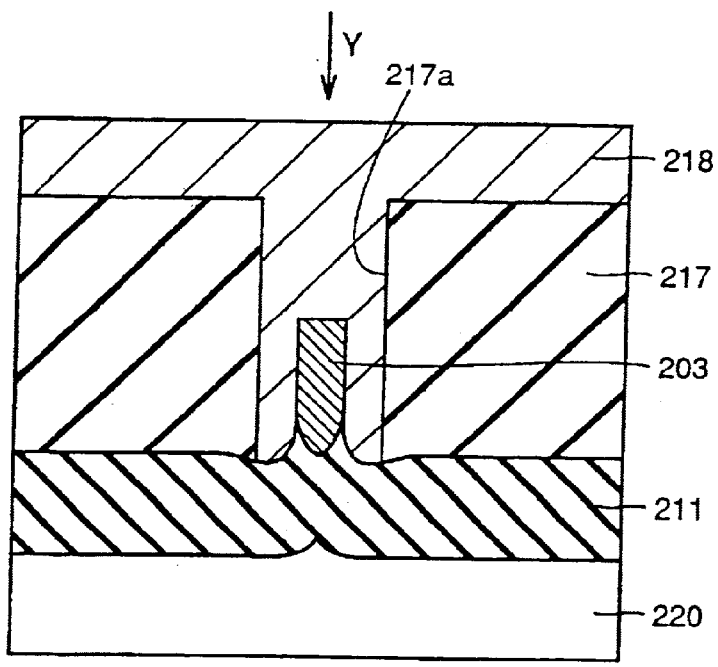
FIG. 52 is a cross sectional view showing connection between the conventional thin film transistor and a conductive layer over the source/drain region.
Figure 53:
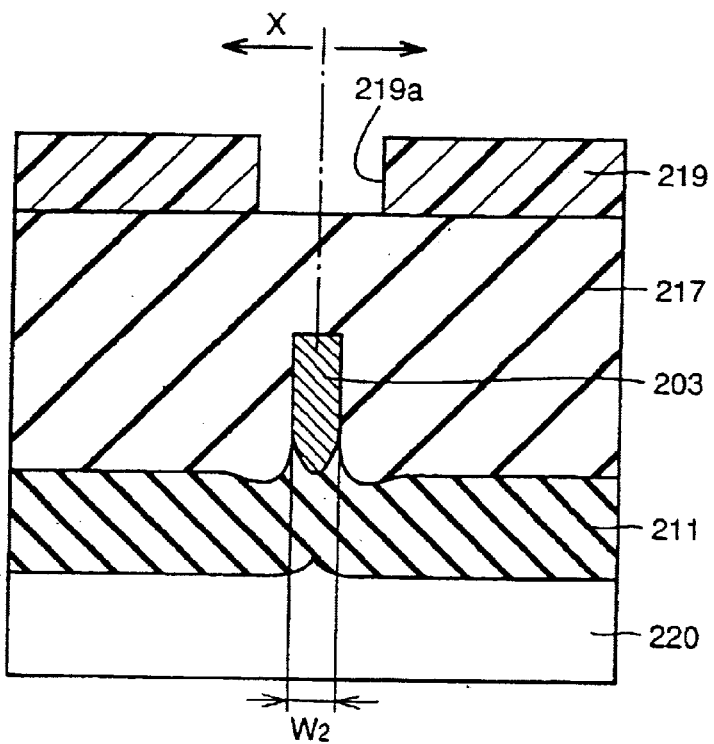
FIG. 53 is a schematic cross sectional view for describing generation of overlay displacement of a mask.
Figure 54:
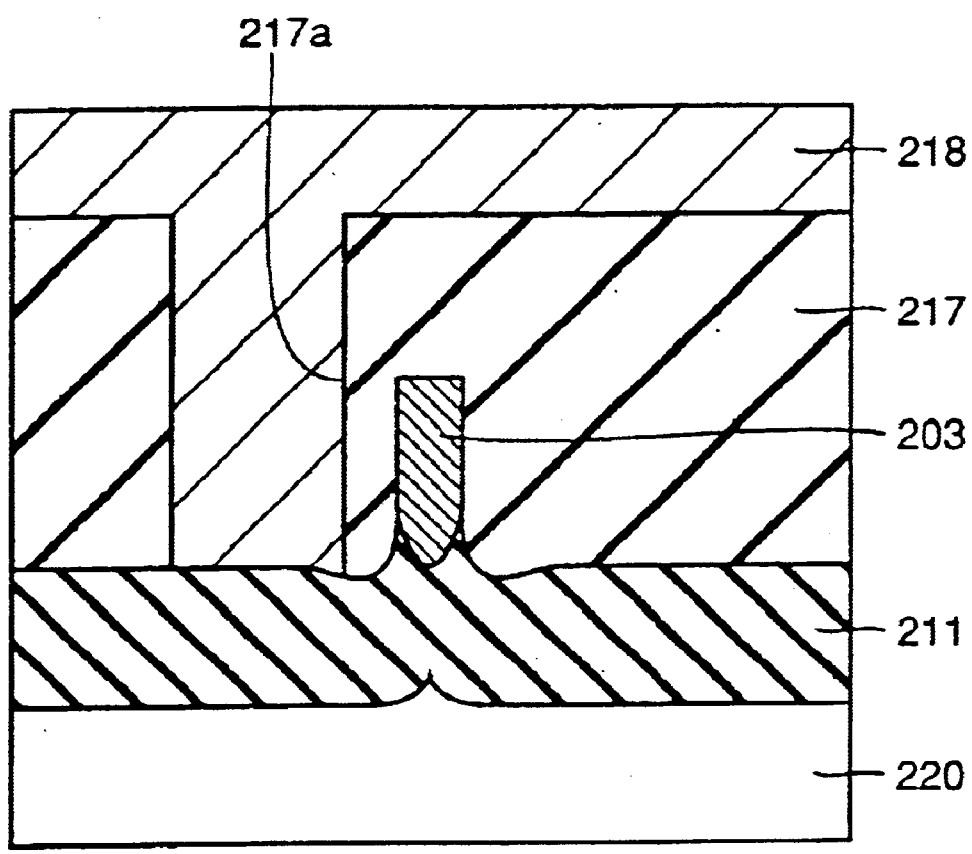
FIG. 54 is a schematic cross sectional view showing shift of a contact hole due to overlay displacement of the mask.

Furthermore, semiconductor layer 3 having a channel region has width $W_1$ smaller than height $H_1$ as in the conventional example (FIG. 48). This contributes to superior current drivability and less degradation in characteristics by a shorter channel, and brings about an advantage of preventing electrical effect imposed by external electrode interconnections.

Embodiment 2

Figure 20:
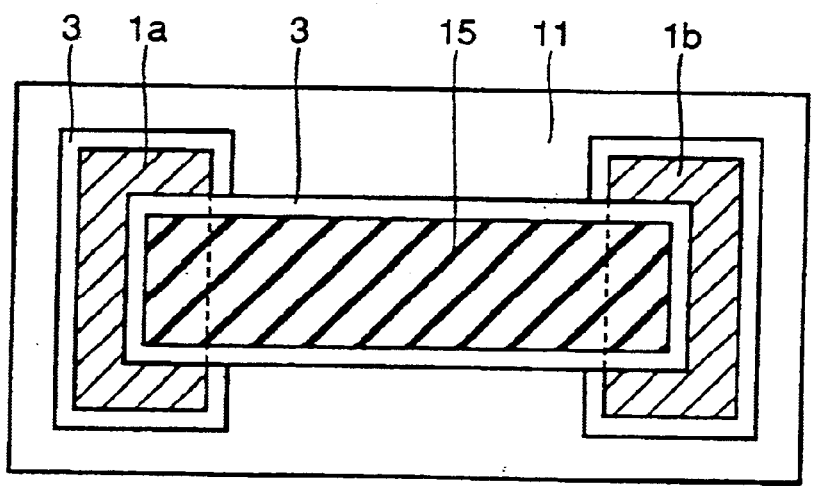
FIG. 20 is a schematic cross sectional view showing a method of manufacturing a thin film transistor according to a second embodiment of the present invention.

In the first embodiment, polycrystalline silicon pattern 3 serving as a channel region is formed inside hole 15a provided in silicon nitride film 15 as shown in FIG. 4, 9 and 17. However, as shown in FIG. 20, the silicon nitride film can be left as a rectangular pattern 15 and the pattern of channel polysilicon 3 can be formed at the outer periphery thereof. In such a case, polysilicon pattern 3 is left also at the outer periphery of first and second conductive layers 1a and 1b.

Since the steps thereafter are similar to those in the first embodiment described above, description thereof will not be repeated.

In accordance with the manufacturing method of the present embodiment, the plane area occupied by silicon nitride film 15 to be removed is small so that time required for removing silicon nitride film 15 can be reduced as compared to the first embodiment.

Embodiment 3

In the first embodiment, channel polysilicon pattern 3 is in the shape of a frame and two thin film transistors are connected in parallel. However, in a third embodiment shown in FIG. 21 there is only one transistor provided to reduce the occupied plane area.

Figure 21:
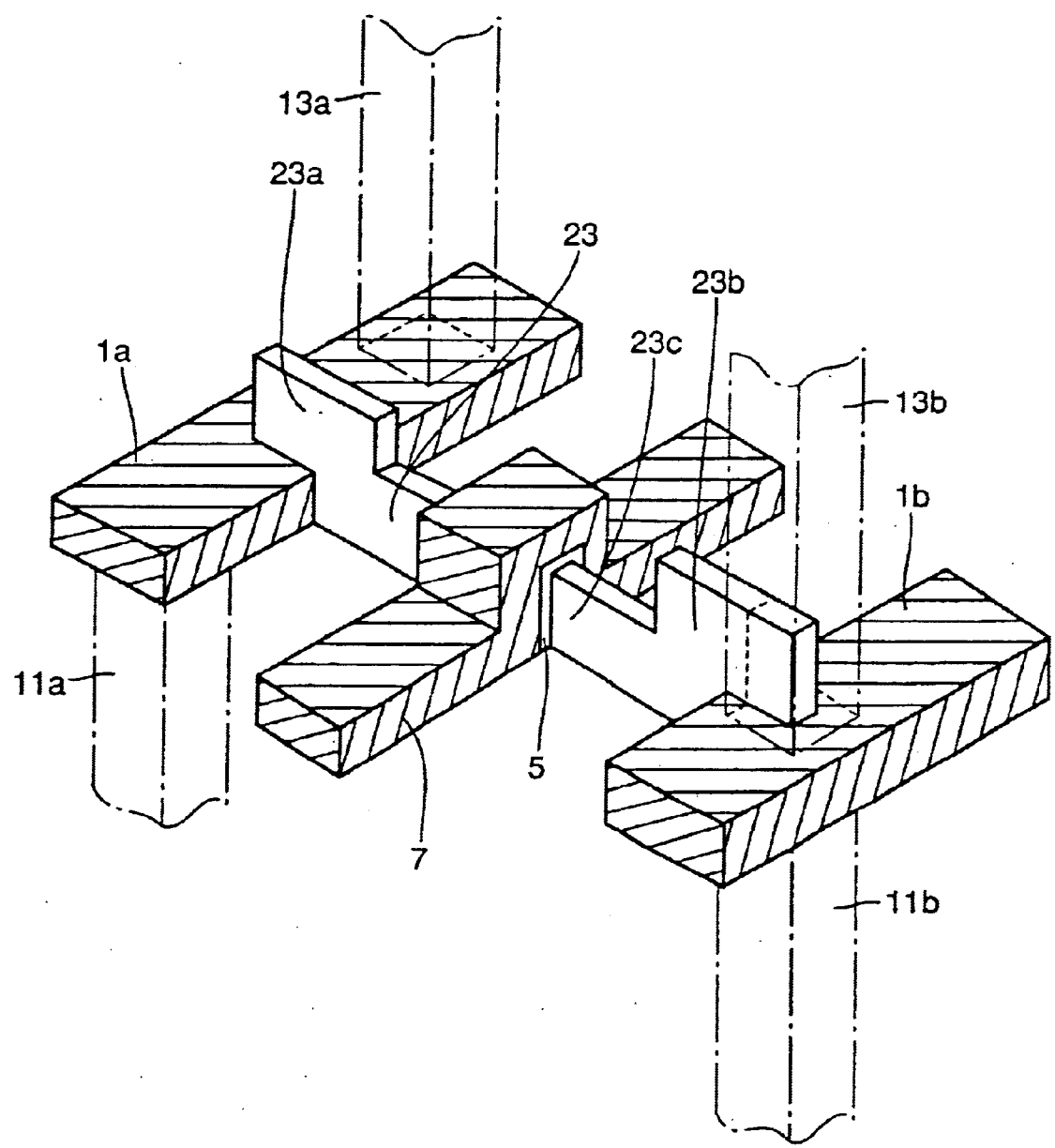
FIG. 21 is a perspective view schematically showing the structure of a thin film transistor according to a third embodiment of the present invention.

Referring to FIG. 21, in this case channel polysilicon pattern 23 does not have a frame-like shape but has a shape extending as a straight line. Opposing end portions 23a and 23b extending linearly are placed on top of first and second conductive layers 1a and 1b and in contact therewith, respectively.

Since the rest of the structure is generally similar to that of the first embodiment shown in FIG. 1, the identical elements are labeled with the identical characters and description thereof will not be repeated.

Now, a method of manufacturing a thin film transistor according to the present embodiment will be described. According to the manufacturing method of the present embodiment, first, the steps similar to those of the first embodiment shown in FIGS. 15–17 are taken. Thereafter, with reference to FIG. 22, a resist pattern 25 covering only the upper portion of polysilicon pattern 3 along one sidewall of hole 15a is formed and polysilicon pattern 3 is subjected to dry etching using resist pattern 25 as a mask. Resist pattern 25 is then removed and silicon nitride film 15 is removed similarly to the first embodiment.

Figure 23:
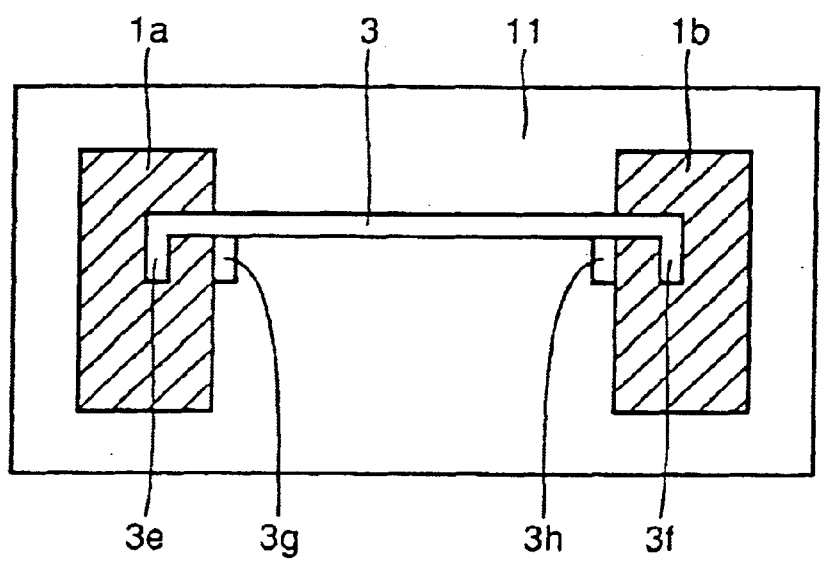

Referring to FIG. 23, as a result of such removal, channel polysilicon pattern 3 remains only at the portion along one sidewall of the hole. Similarly to the first embodiment, the gate oxide film and the gate electrode layer are formed to complete a thin film transistor shown in FIG. 21.

Figure 22:
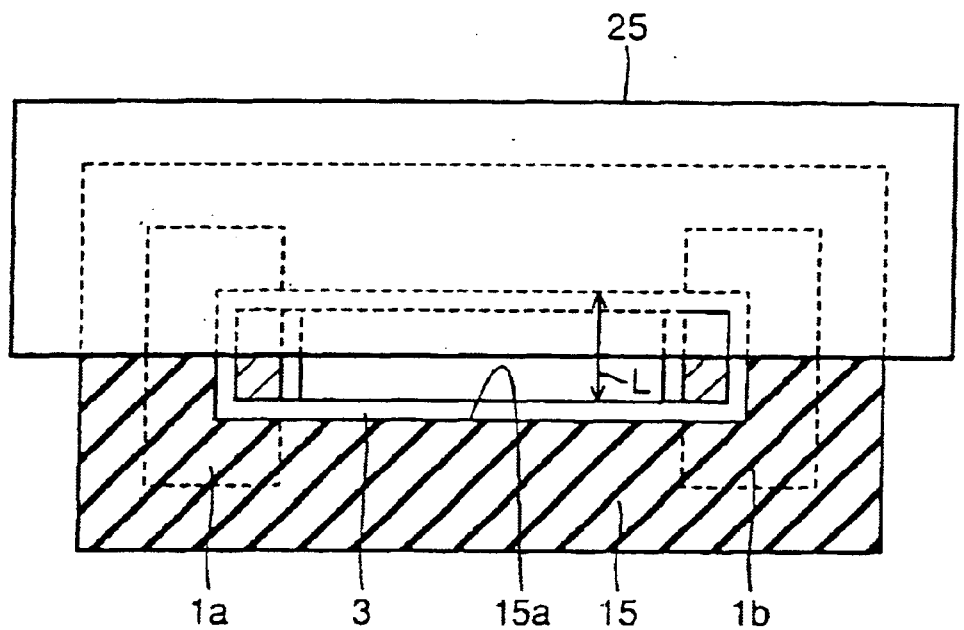
FIGS. 22 and 23 are schematic plan views showing the first and second steps, respectively, of a method of manufacturing a thin film transistor according to the third embodiment of the present invention.

In the manufacturing method shown in FIGS. 22 and 23, intersecting portions 3e, 3f, 3g and 3h are left near the ends of channel polysilicon pattern 3. However, by appropriately controlling a width L of hole 15a shown in FIG. 22, channel polysilicon pattern 3 having a substantially straight line as shown in FIG. 21 can be obtained.

Since only one transistor is provided as a thin film transistor according to the present embodiment instead of the two transistors connected in parallel as in the first embodiment, the plane area occupied by the transistor can be reduced.

Embodiment 4

Although the upper surface and opposing side surfaces of semiconductor layer 3 forming a channel portion are covered with gate electrode layer 7 in the first through third embodiments described above, the lower surface thereof is not covered with gate electrode layer 7. Description will now be made of a method of manufacturing a thin film transistor in which the upper, opposing side, and lower surfaces of semiconductor layer 3 are all covered with the gate electrode layer.

Figure 10:
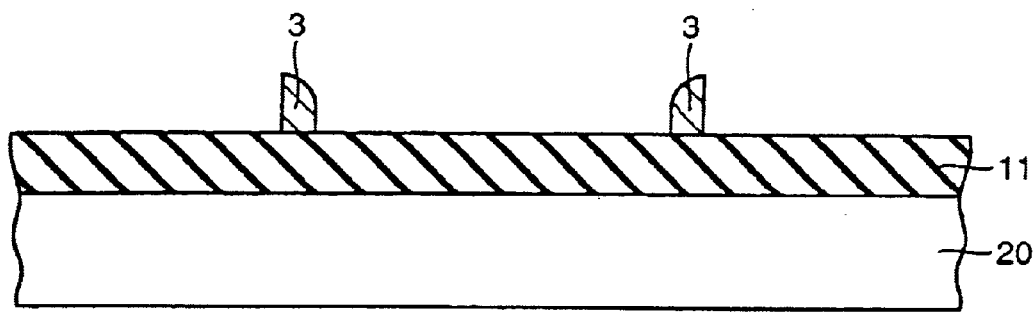
Figure 24:
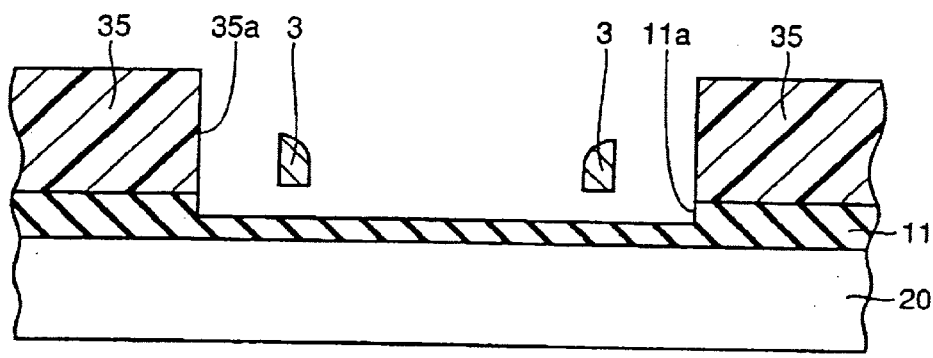
FIGS. 24 and 25 are schematic plan views showing the first and second steps, respectively, of a method of manufacturing a thin film transistor according to a fourth embodiment of the present invention.

The manufacturing method of the present embodiment begins with the steps similar to those in the first embodiment shown in FIGS. 8–10. Referring to FIG. 24, resist pattern 35 is next formed on interlayer insulating layer 11. Resist pattern 35 has an opening 35a exposing at least a region of channel polysilicon pattern 3 to serve as a channel. Using resist pattern 35 as a mask, interlayer insulating layer 11 is etched away with hydrofluoric acid by 0.05 $\mu$m. Such etching removes a prescribed thickness of interlayer insulating layer 11 under the portion of channel polysilicon pattern 3 to serve as a channel. As a result, the portion of channel polysilicon pattern 3 to serve as a channel floats from interlayer insulating layer 11. Channel polysilicon pattern 3, however, will not be peeled off because it is supported at opposing ends by interlayer insulating layer 11 through first and second conductive layers 1a and 1b. Resist pattern 35 is then removed.

Figure 25:
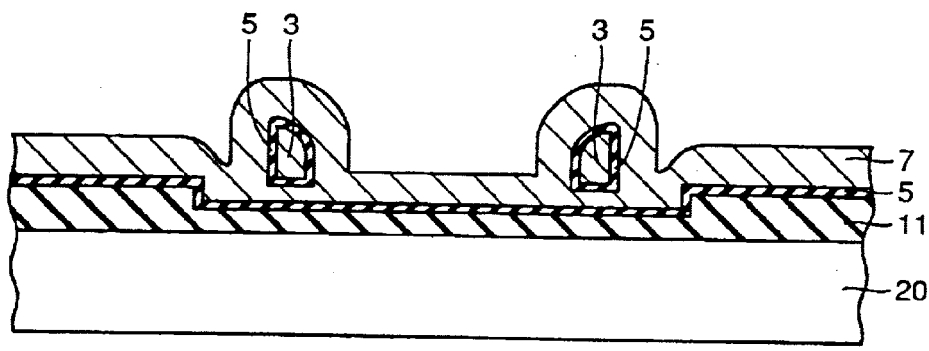

Referring to FIG. 25, gate insulating layer 5 and gate electrode layer 7 are deposited by, for example, low pressure CVD and patterned, thereby implementing a structure in which gate electrode layer 7 surrounds all of the upper, opposing side, and lower surfaces of a portion of a channel polysilicon pattern 3 to serve as a-channel. This can be achieved because coverage of a deposited film is good in low pressure CVD.

Since gate electrode 7 covers all the upper, opposing side, and lower surfaces of semiconductor layer 3 to serve as a channel region in the thin film transistor according to the present embodiment, a thin film transistor better controlled by the gate electrode can be obtained.

Embodiment 5

Another structure will be disclosed which achieves the same object as the fourth embodiment described above.

Figure 26:
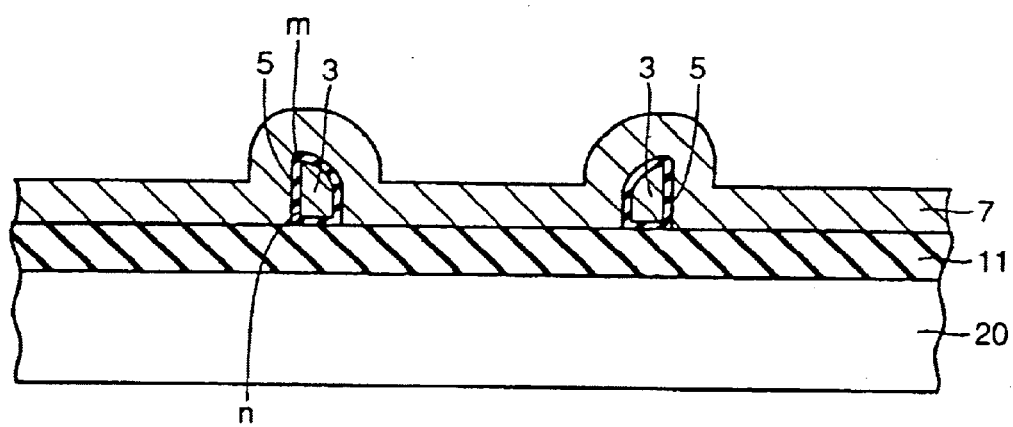
FIG. 26 shows a step of a method of manufacturing a thin film transistor according to a fifth embodiment of the present invention.

Referring to FIG. 26, in a thin film transistor according to the present embodiment, gate electrode layer 7 covers upper and opposing side surfaces of a portion of channel polysilicon pattern 3 to serve as a channel and also covers the entire side surface from an upper end m to a lower end n thereof.

Since the rest of the structure is similar to that of the first embodiment, the identical components are indicated by the identical characters and description thereof will not be repeated.

Next, the manufacturing method of the present embodiment will be described.

The manufacturing method of the present embodiment begins with the steps similar to those of the first embodiment shown in FIGS. 8–10. Next, silicon oxide film 5 is formed by thermal oxidation method to cover the surface of channel polysilicon pattern 3 as shown in FIG. 26. At this point in time, oxidant is diffused from above to form a silicon oxide film at the surface of channel polysilicon pattern 3 and is also diffused to the inside of interlayer insulating layer 11 of a silicon oxide film to form an oxide film also at the lower portion of channel polysilicon pattern 3. Thereafter, phosphorus-doped polysilicon film 7 serving as a gate electrode layer is deposited by CVD and patterned to complete a thin film transistor.

Although in the structure of the thin film transistor of the present embodiment shown in FIG. 26 gate electrode layer 7 does not exist at the lower surface of semiconductor layer 3 serving as a channel in contrast to the fourth embodiment, the entire side surface of a portion of the channel polysilicon pattern to serve as a channel is covered from the upper end m to the lower end n, so that a thin film transistor better controlled by the gate electrode than that in the first embodiment can be obtained.

Embodiment 6

The object of the present embodiment is to reduce an off-current of a thin film transistor.

The off-current is considered as a produced current generated in a depletion layer of the drain end. Therefore, the width of the drain end is reduced as one method of reducing an off-current because reduction in width decreases the volume of the depletion layer and therefore the produced current. However, conventionally the channel width of the transistor is mostly set at the minimum processed size determined by photolithography and the width of the drain end cannot be reduced further. The present embodiment discloses a technique for reducing the width of the drain end to a size smaller than the minimum processed size determined by photolithography.

Figure 27:
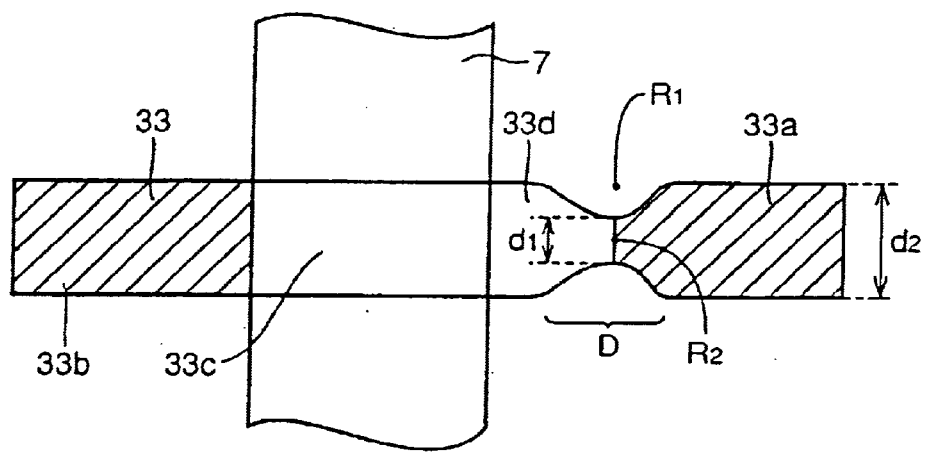
FIG. 27 is a plan view schematically showing the structure of a thin film transistor according to a sixth embodiment of the present invention.

Referring to FIG. 27, the thin film transistor according to the present embodiment has a semiconductor layer 33, a gate insulating layer (not shown), and gate electrode layer 7.

At semiconductor layer 33, a drain region 33a and a source region 33b are formed on both sides of a channel region 33c to define channel region 33c. Gate electrode 7 is formed to face channel region 33c with the gate insulating layer interposed therebetween.

In this thin film transistor, a drain offset 33d is provided between channel region 33c and drain region 33a. A line width $d_1$ of semiconductor layer 33 at a junction portion of drain region 33a and drain offset 33d is set smaller than a line width $d_2$ of the remaining portions and also smaller than the minimum processed size determined by photolithography.

Usually, semiconductor layer 33 is patterned by etching the conductive layer using a resist pattern as a mask. The resist pattern is formed by directing exposure light transmitted through a photomask (reticle) to photoresist and develop the resist.

The manufacturing method of the present embodiment is characterized in the structure of the photomask for patterning semiconductor layer 33. Now, detailed description will be made of the structure of the photomask.

Figure 28:
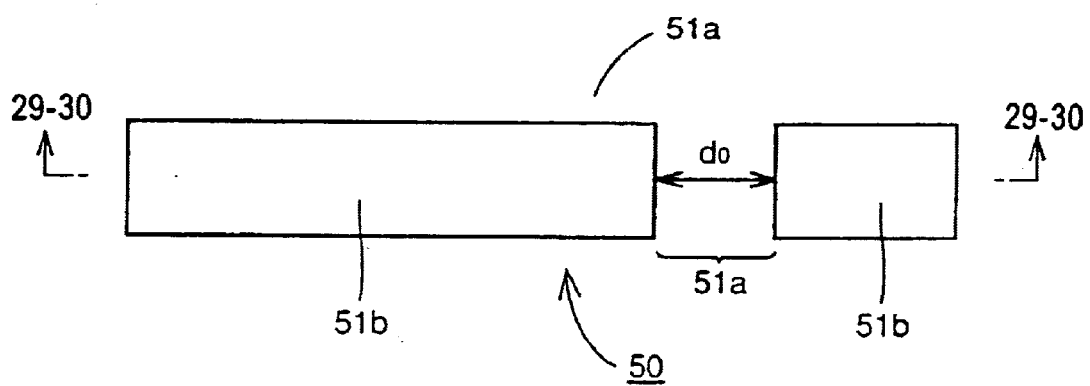
FIG. 28 is a plan view schematically showing the structure of a photomask used for manufacturing the thin film transistor according to the sixth embodiment of the present invention.
Figure 29:
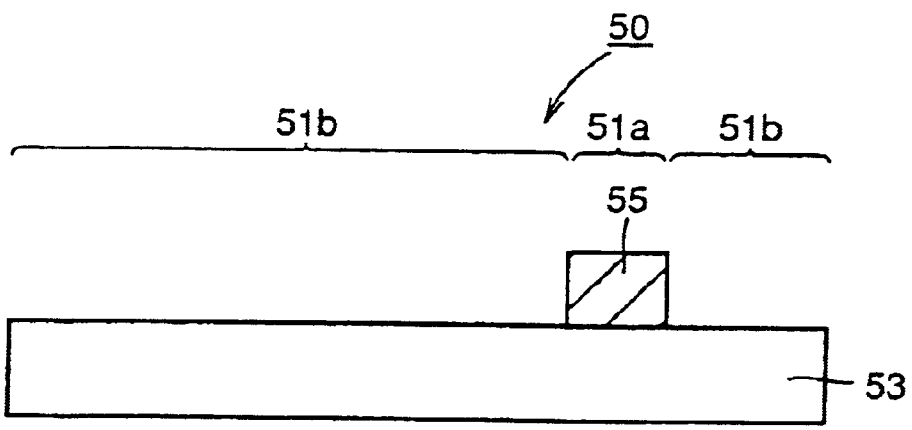
FIGS. 29 and 30 are cross sectional views of the photomask shown in FIG. 28 taken along the line C—C, showing first and second examples.
Figure 30:
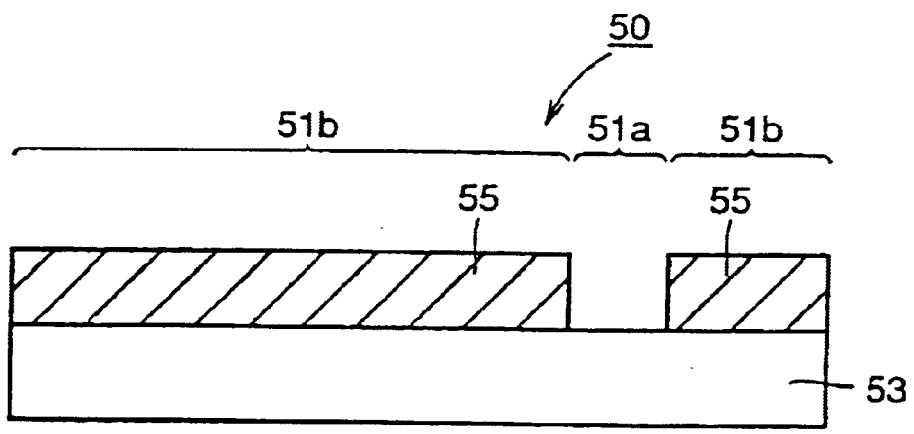

Referring to FIGS. 28 and 29, description here relates to the case where a portion 51b corresponding to a region where semiconductor layer 33 (FIG. 27) is formed is a transmissive region. The photomask has a transparent substrate 53 and a light shielding film 55 of, for example, chromium. The light shielding film 55 is formed to cover a region excluding portion 51b corresponding to the region for forming semiconductor layer 33 and region 51a corresponding to a drain end portion D (FIG. 27). It should be noted that if the pattern on the photomask is transferred to a wafer while demagnified by n, a width $d_O$ of region 51a corresponding to drain end portion D is smaller than the size equal to (the minimum processed size on the wafer)×(demagnification n).

If portion 51b in FIG. 28 corresponding to a region where the semiconductor layer is formed is to serve as a light shielding region, light shielding film 55 is provided at portion 51b corresponding to the region for forming the semiconductor layer, covering the substrate except for region 51a corresponding to drain end portion D.

If the resist is patterned using photomask 50 shown in FIG. 28 and the conductive layer is patterned using the resist pattern as a mask to form the gate electrode layer, the gate electrode layer has a shape as shown in FIG. 27 when viewed from the top. Referring to FIG. 27, line width $d_1$ at drain end D of the gate electrode layer is smaller than line width $d_2$ of the remaining portions. The reason will be described in detail below.

Figure 31A:
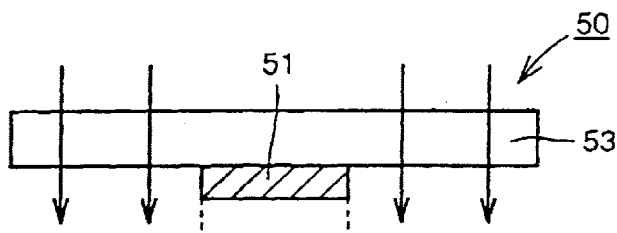
FIG. 31A is a cross sectional view of the photomask for describing formation of channel polysilicon with its drain end having the line width smaller than the line width of the remaining portions.
Figure 31B:
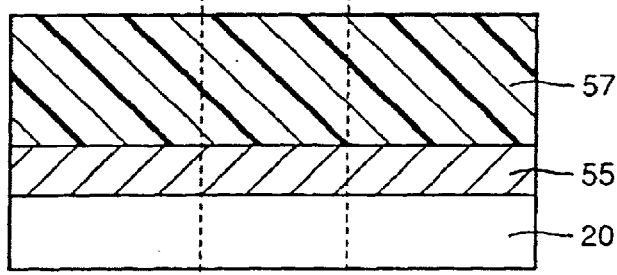
FIG. 31B is a cross sectional view of a wafer.
Figure 31C:
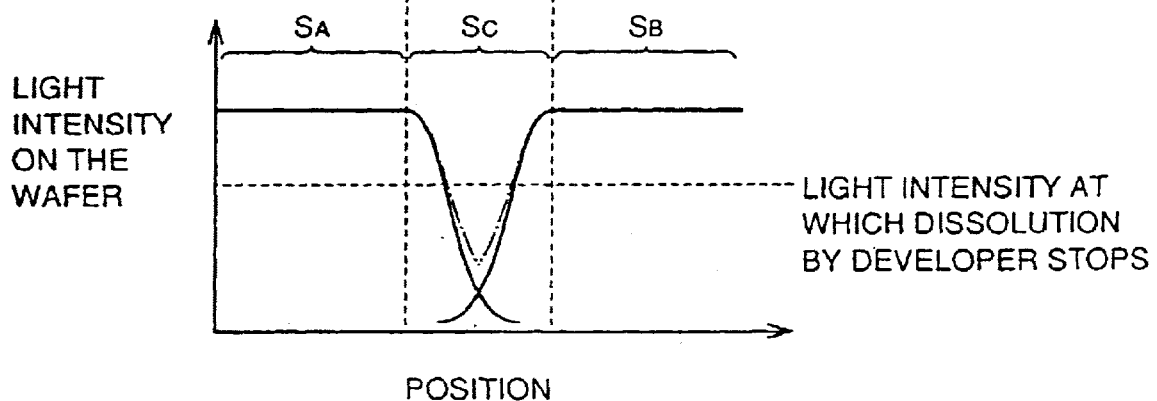
FIG. 31C shows light intensity on the wafer.

As shown in FIG. 31A, when a width $d_{PO}$ of pattern 51 of photomask 50 has a size equal to or greater than the size of (the minimum processed size on the wafer)× (demagnification n), the light intensity of the exposure light transmitted through photomask 50 on the wafer is as shown in FIG. 31C.

Referring to FIG. 31C, the light somewhat diffracts to the region which is not intended to be irradiated with the exposure light (unexposed region) $S_c$ from the regions to be exposed (exposed regions) $S_A$ and $S_B$. If width $d_{PO}$ of the pattern of photomask 50 has the size described above, the sum (indicated by the chain line with one dot) of light intensities of exposure light beams diffracted from exposed regions $S_A$ and $S_B$ to unexposed region $S_C$ does not reach the light intensity at which the resist stops being dissolved by developer. Therefore, negative resist 57, a portion of which not irradiated with light is removed by developer, is employed as the resist in FIG. 31B, resist 57 is dissolved and removed by developer at the portion corresponding to unexposed region $S_C$. Hence, if film 55 on substrate 20 is etched using such resist pattern as a mask, etched film 55 remains at portions corresponding to exposed regions $S_A$ and $S_B$ but removed at the portion corresponding to region $S_C$.

Meanwhile, if line width $d_{PO}$ of light shielding film 51 shown in FIG. 31A has a size smaller than the size equal to (the minimum processed size on the wafer)× (demagnification n), the light intensity of the exposure light transmitted through photomask 50 on the wafer is as shown in FIG. 32.

Referring to FIG. 32, in this case, the sum (indicated by the chain line with one dot) of the light intensities of exposure light beams diffracted from exposed regions $S_A$ and $S_B$ to unexposed region $S_C$ exceeds the light intensity at which the resist stops being dissolved by developer. As a result, if negative resist is used as resist 57 in FIG. 31B, the portion corresponding to region $S_C$ of the resist cannot be removed by developer.

Consequently, if film 55 is etched using the resist pattern as a mask, etched film 55 remains at the portion corresponding to region $S_C$ as well as the portions corresponding to exposed regions $S_A$ and $S_B$.

As shown in FIG. 27, light is less likely to diffract at region $R_1$ from the exposed region than at region $R_2$. As a result, the portion of etched film 55 (FIG. 29) corresponding to the unexposed region has line width $d_1$ smaller than line width $d_2$ of the remaining portions.

As described above, channel polysilicon film 33 having a shape as shown in FIG. 27 is obtained if the photomask shown in FIG. 28 is employed.

As a result, an off-current can be reduced in the structure of the thin film transistor of the present embodiment.
Embodiment 7

Figure 33:
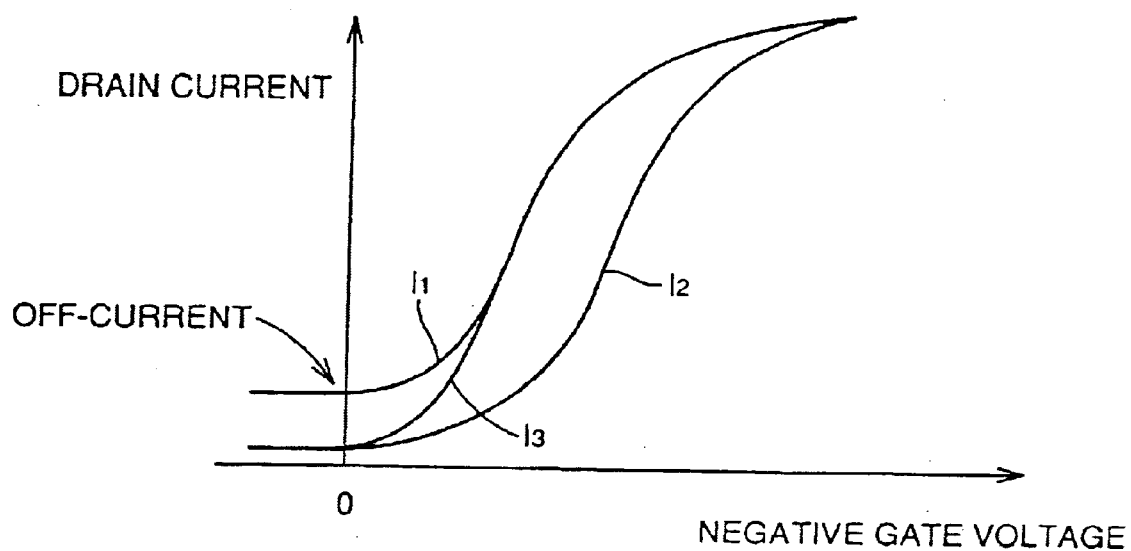
FIG. 33 is a graph showing the relationship between the drain current and the negative gate voltage of the thin film transistor.

Referring to FIG. 33, the conventional transistor has a disadvantageous characteristic of having a great off-current (the drain current obtained when the gate voltage is 0V) as indicated by a solid line 11. The off-current is said to be generated by production of electron-hole pairs at crystal defects present at the high electric field region of the drain end (the plane where the drain and the channel contact with each other).

A method has been proposed in which nitrogen is introduced into polysilicon in order to inactivate crystal defects (crystal defects in the polysilicon forming a channel, source or drain, such as tangling bond). This method is disclosed by, for example, C. K. Yang et al. in "Improved Electrical Characteristics of Thin-Film Transistors Fabricated on Nitrogen-Implanted Polysilicon Films", IEDM 44, pp. 505–508. Crystal defects are inactivated in accordance with this method because the introduced nitrogen combines with the tangling bond of silicon.

Figure 34:
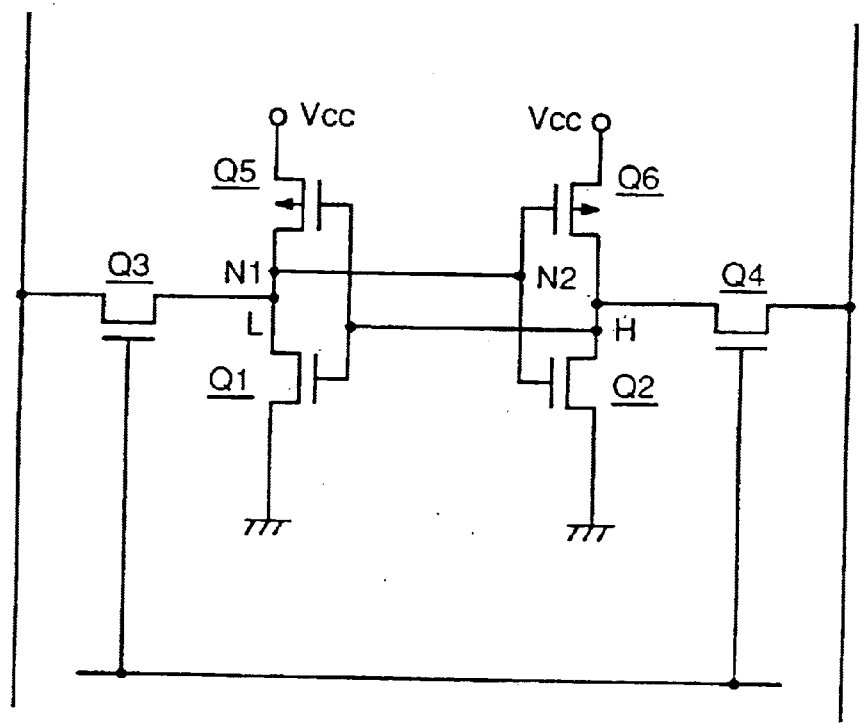
FIG. 34 is a circuit diagram of memory cell of an SRAM of the CMOS type.

However, since nitrogen acts as impurity of the donor type in silicon, it changes threshold voltage Vth of the transistor in the negative direction as shown by a solid line $l_2$ in FIG. 33. If such thin film transistors are employed as load transistors Q5 and Q6 of an SRAM memory cell shown in FIG. 34, load transistor Q6 having a gate connected to a node N1 pulled down to Low is not easily turned on. This makes it difficult to raise the potential of a node N2 to the Vcc potential, rendering the data storage state of the SRAM unstable.

In view of the foregoing, not only nitrogen but also other impurities which change the threshold voltage in the positive direction are introduced to the channel portion of the transistor.

The manufacturing method will be described with reference to FIGS. 35 and 36.

Figure 35:
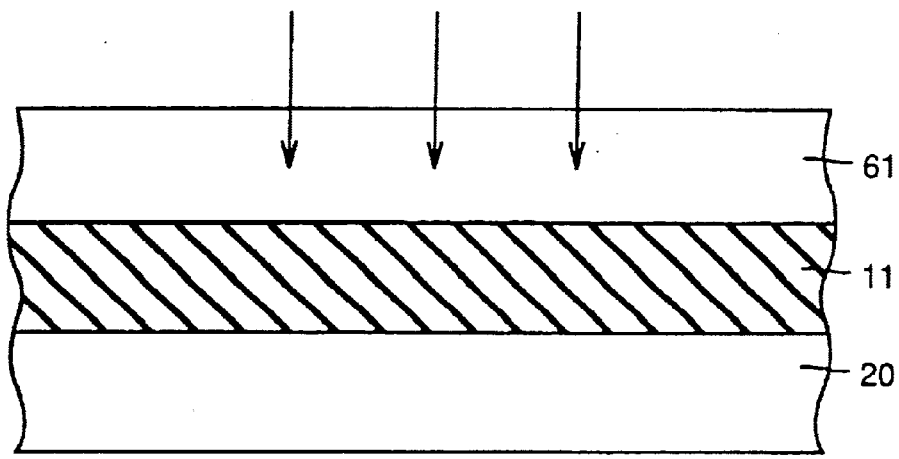
FIGS. 35 and 36 are schematic cross sectional views showing the first and second steps of a method of manufacturing a thin film transistor according to a seventh embodiment of the present invention.
Figure 36:
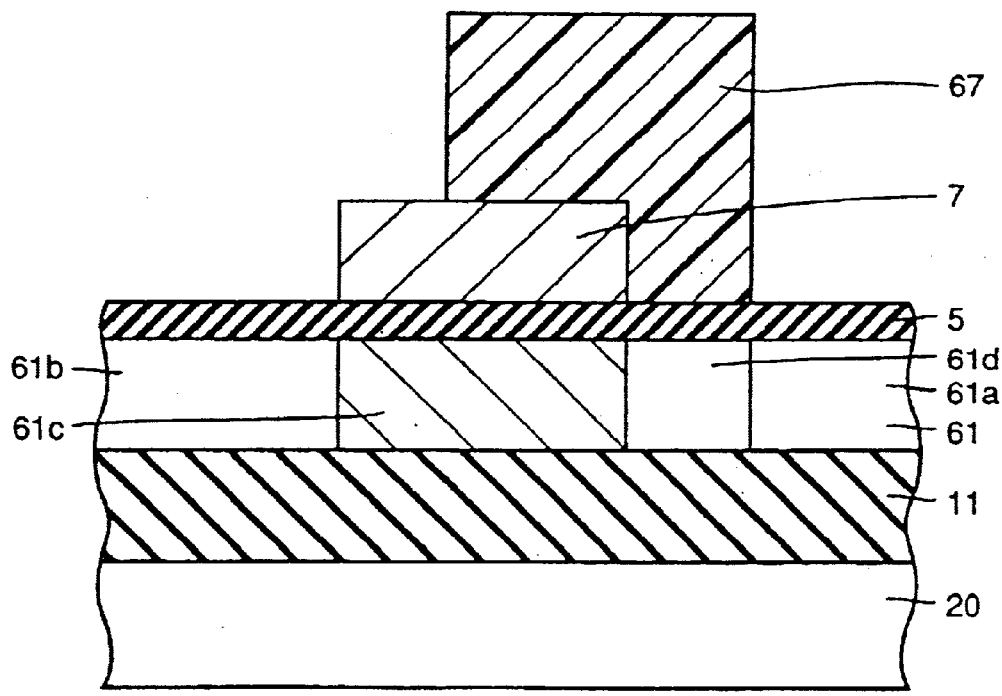

Referring to FIG. 35, a channel polysilicon film 61 is formed to have a thickness of 40 nm by, for example, CVD on silicon oxide film 11 which is formed on silicon substrate 20. Nitrogen ions are implanted from above into channel polysilicon film 61 at the dose of $5 \times 10^{14}$ cm$^{-2}$. Next, fluorine ions are introduced into channel polysilicon film 61 from above at the dose of $5 \times 10^{14}$ cm$^{-2}$.

Next, gate oxide film 5 is formed to have a thickness of 40 nm by, for example, CVD. Gate polysilicon film 7 is formed on gate oxide film 5 to have a thickness of 0.2 μm by CVD and patterned using conventional photolithography and etching technique.

Resist pattern 67 is next formed and using this pattern as an implantation mask $BF_2$ ions are introduced into channel polysilicon film 61, thereby forming a drain region 61a and a source region 61b to define a channel region 61c. Here, a drain offset 61d is formed by providing drain region 61a away from the end of gate electrode 7. Drain offset 61d is provided for relaxing the drain electric field.

In accordance with the manufacturing method above, a thin film transistor including nitrogen and fluorine in channel region 61c can be formed.

Fluorine serves to inactivate crystal defects in polysilicon and to form negative fixed charges by diffusing into gate oxide film 5. Therefore, fluorine acts to cancel the change of threshold voltage Vth in the negative direction due to the donor effect of nitrogen. Consequently, an off-current can be reduced while maintaining threshold voltage Vth of the transistor at an appropriate value as shown by a solid line 13 in FIG. 33.

It should be noted that neon and oxygen function similarly to fluorine. Arsenic ions or phosphorus ions may be implanted in place of fluorine ions described above.

While the description above relates to a top gate thin film transistor, the method above can also be applied to a bottom gate thin film transistor. The effect described above becomes more prominent if annealing process is carried out at 700–900° C. after implantation of nitrogen and fluorine ions.

The present embodiment can be applied to the thin film transistors according to the first through fifth embodiments.
Embodiment 8

Figure 37:
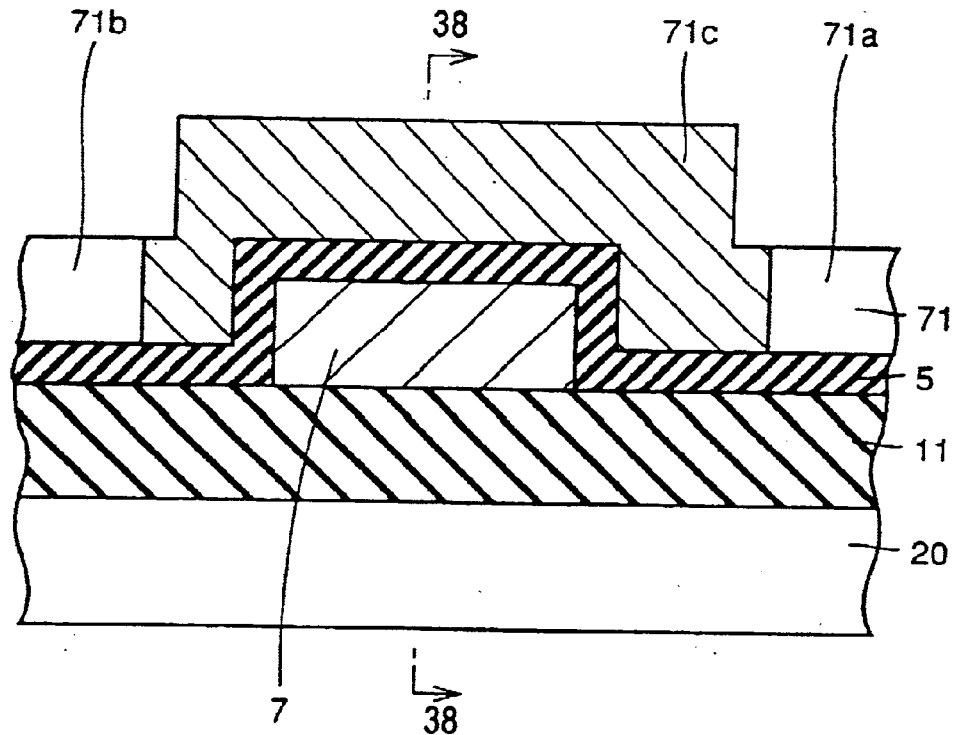
FIG. 37 is a cross sectional view schematically showing the structure of a bottom gate thin film transistor.
Figure 38:
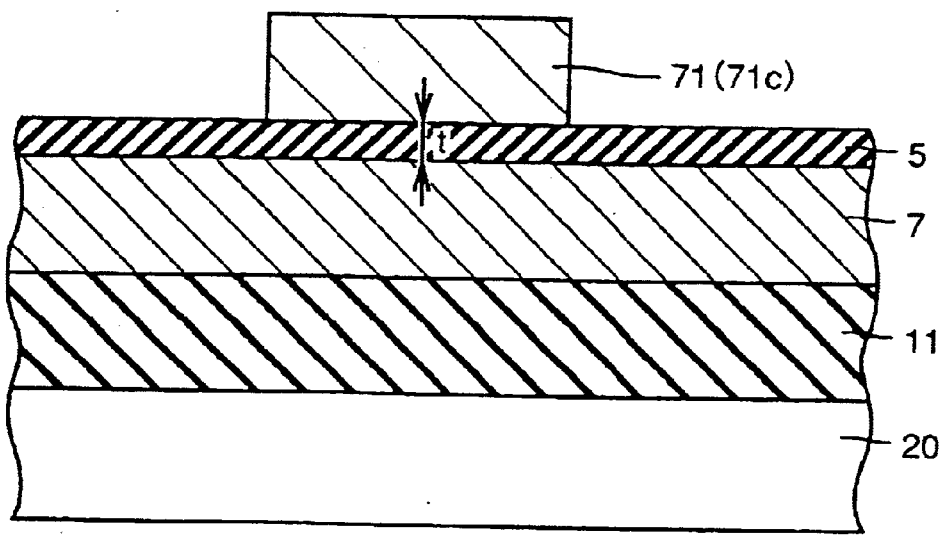
FIG. 38 is a schematic cross sectional view taken along the line E—E in FIG. 37.

There is a conventional technique of performing thermal oxidation process after the cross sectional structures as shown in FIGS. 37 and 38 are obtained in order to reduce the thickness of channel polysilicon film 71 for reduction of an off-current. This technique is disclosed by, for example, M. Sasaki et al. in "The Impact of Oxidation of Channel Polysilicon on the Trap-Density of Submicron Bottom-Gate TFT's" *IEEE ELECTRON DEVICE LETTERS*, VOL. 15, No. Jan. 1, 1994, pp. 1–3.

Figure 39:
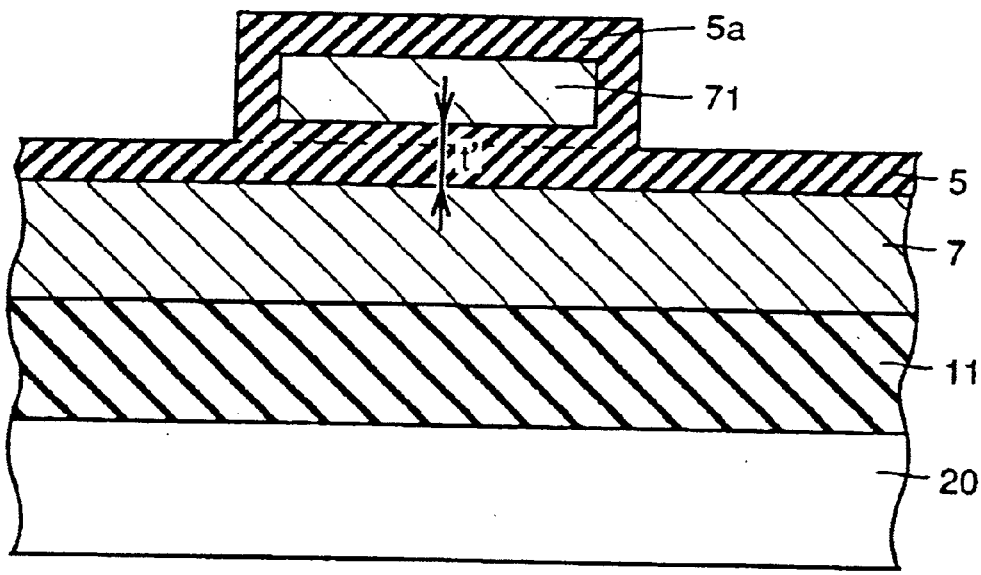
FIG. 39 is a cross sectional view showing the channel polysilicon shown in FIG. 38 after thermal oxidation process.

In accordance with this method, however, the thickness of the gate oxide film of the transistor is increased from t to t' by the thermal oxidation process as shown in FIG. 39. This is because oxidant diffuses also into gate oxide film 5 during thermal oxidation described above to oxidize the lower surface of channel polysilicon film 71 and the upper surface of gate polysilicon film 7 positioned thereunder, whereby an oxide film is grown. Such increase in thickness of the gate oxide film leads to rise in threshold voltage Vth of the transistor.

Description will now be made of the structure of the present embodiment with reference to FIG. 40.

Figure 40:
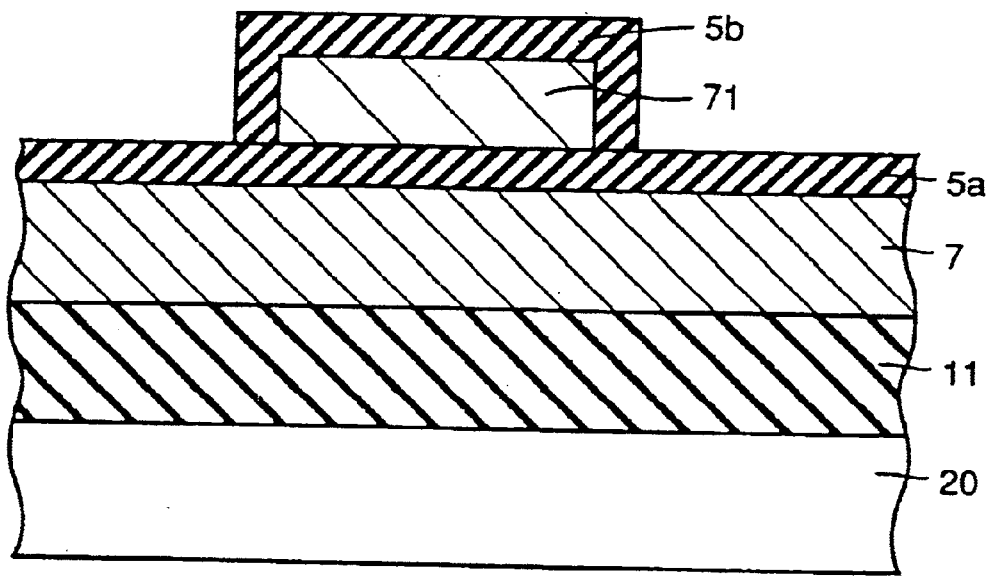
FIG. 40 is a cross sectional view schematically showing the structure of a thin film transistor according to an eighth embodiment of the present invention.

Referring to FIG. 40, an oxynitride ($SiO_xN_{1-x}$) film is used as gate insulating film 5a in the present embodiment. Film 5a can be easily formed by low pressure CVD using silane gas, ammonium gas and $N_2O$ gas, and functions to suppress diffusion of oxidant more strongly than the silicon oxide film. The oxynitride film is a mixed film of $SiO_2$ and SiN. It is dense and has the characteristics similar to those of SiN film of hardly allowing oxidant to diffuse. The oxynitride film has a smaller coefficient of allowing oxidant to diffuse in the film than a pure silicon oxide film in the conventional example. Therefore, by using the oxynitride film as the gate insulating film, oxidation of the upper surface of gate polysilicon film 7 and the lower surface of channel polysilicon film 71 is suppressed even when the thermal oxidation process is performed as described above. Consequently, increase in thickness of gate insulating film 5a can be suppressed.

Since channel polysilicon film 71 is oxidized from the upper and opposing side surfaces, the film is reduced in thickness. Therefore, if the oxynitride film is used as gate insulating film 5a and thermal oxidation process is carried out after the pattern of channel polysilicon film 71 is formed, an off-current can be reduced while suppressing increase in threshold voltage Vth of the thin film transistor.

Description will now be made of an example of the manufacturing method of the present embodiment.

Referring to FIG. 40, polysilicon film 7 having a thickness of 0.1 μm and serving as a gate electrode is formed by CVD on silicon oxide film 11 which is formed on silicon substrate 20. When the film 7 is deposited, phosphorus is added thereto. Film 7 is then processed to have a prescribed pattern by conventional photolithography and etching technique. Oxynitride film 5a is deposited to have a thickness of 40 nm by low pressure CVD. Next, channel polysilicon film 71 is deposited to have a thickness of 40 nm by CVD and processed to have a prescribed pattern. In the dry $O_2$ atmosphere at 700–900° C., thermal oxidation process is carried out and channel polysilicon pattern 71 is oxidized and reduced in thickness. Thereafter, a resist pattern is formed and using the pattern as a mask $BF_2$ ions are implanted to channel polysilicon 71 at a dose of $1\times10^{15}$ $cm^{-2}$. Through such ion implantation source/drain regions are formed to complete a transistor.

As a method for forming an oxynitride film, another method can be employed in which the silicon oxide film formed by CVD is exposed to ammonium atmosphere at 1000° C. to nitride the film.

The present embodiment can be applied to the thin film transistors in the first through fifth embodiments.

Embodiment 9

Other methods of suppressing increase in threshold voltage Vth due to thermal oxidation process which do not use an oxynitride film will be described below with reference to FIGS. 41 and 42.

Figure 41:
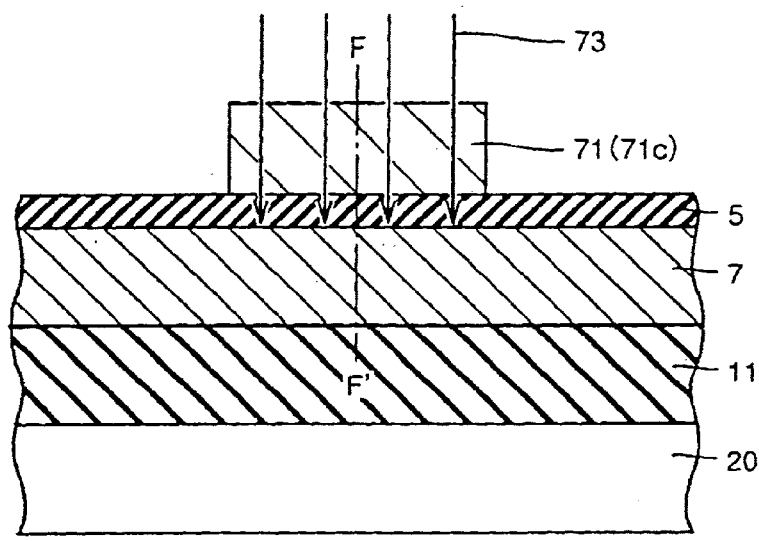
FIG. 41 is a cross sectional view showing a step of a method of manufacturing a thin film transistor according to a ninth embodiment of the present invention.
Figure 42:
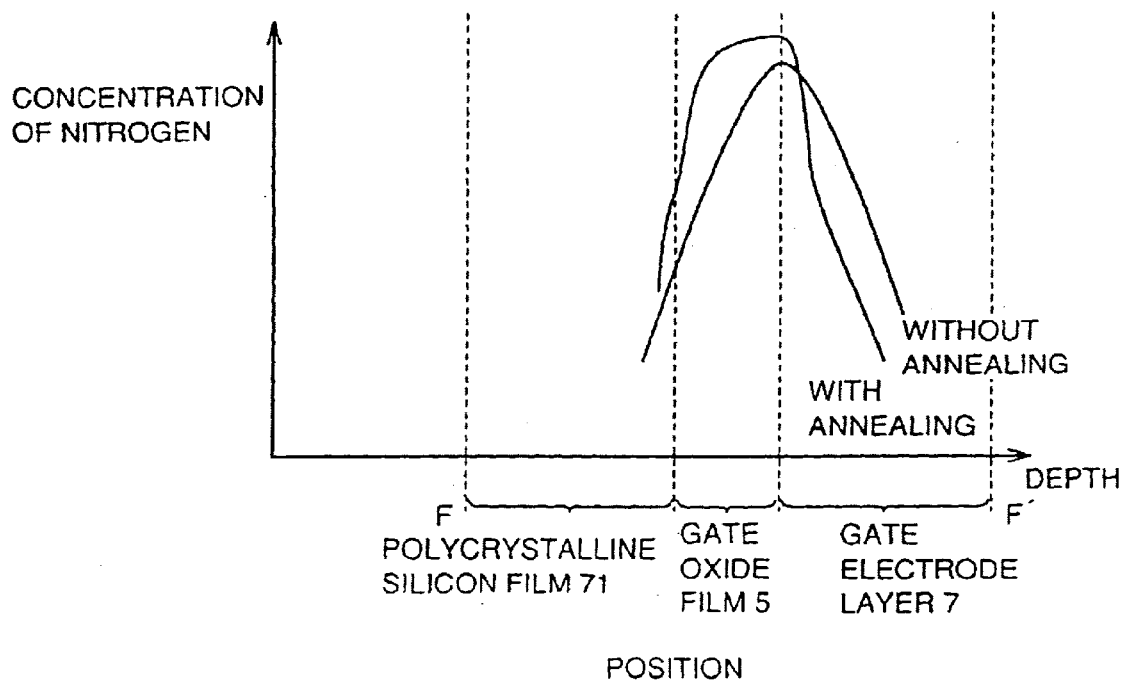
FIG. 42 is a graph showing the concentration of nitrogen introduced to a polysilicon film, a gate insulating layer, and a gate electrode layer of the thin film transistor according to the ninth embodiment of the present invention.

Referring to FIG. 41, after channel polysilicon pattern 71 is formed, nitrogen ions 73 are introduced by ion implantation method to gate polysilicon film 7 and gate oxide film 5. Implantation energy is 20–30 keV which is set so that the range will be near the upper surface of gate polysilicon film 7. Nitrogen ions are implanted at the dose of $1\times10^{14}$ to $1\times10^{17}$ $cm^{-2}$.

This method enables to suppress thermal oxidation of the upper surface portion of gate polysilicon film 7. More specifically, since the implanted nitrogen is present at the upper surface of gate polysilicon film 7 and in gate oxide film 5 as shown in FIG. 42, the oxidant diffusing during thermal oxidation can be blocked and oxidation speed of the polysilicon can be reduced.

Annealing at the temperature of 700–900° C. can be additionally carried out between the nitrogen ion implantation and the thermal oxidation process. Such annealing results in segregation of the nitrogen ions into the gate oxide film as shown in FIG. 42, and in formation of a large amount of Si—N bondage, whereby the effect of suppressing diffusion of the oxidant becomes more prominent.

Such nitrogen ion implantation can be carried out after formation of gate polysilicon film 7 or after that of gate oxide film 5. This method eliminates the need for change in the gate insulating film.

There is another method which does not employ the ion implantation. This method employs nitrogen gas during the CVD step for forming gate polysilicon film 7 to add nitrogen as well as phosphorus to gate polysilicon film 7.

The present embodiment can be applied to the thin film transistors of the first through fifth embodiments.

Embodiment 10

The gate polysilicon film of the conventional thin film transistor includes impurities at the concentration of approximately $10^{20}$ $cm^{-3}$. Therefore, carriers are not depleted at the channel surface of the gate polysilicon film either in the on-state or in the off-state of the transistor, and thus the effective gate capacitance is constantly fixed.

An off-current greatly depends on the electric field of the drain end and can be reduced by relaxing the electric field as described above. This electric field is proportional to the difference between the gate voltage and the drain voltage and to the gate capacitance. Consequently, the electric field can be weakened by decreasing the gate capacitance so that an off-current can be suppressed.

However, since reduction in gate capacitance leads to decrease in an on-current, the gate capacitance cannot be easily reduced. An object of the present embodiment is to obtain both high on-current and low off-current by reducing the gate capacitance in the off-state as compared to the on-state.

Figure 43:
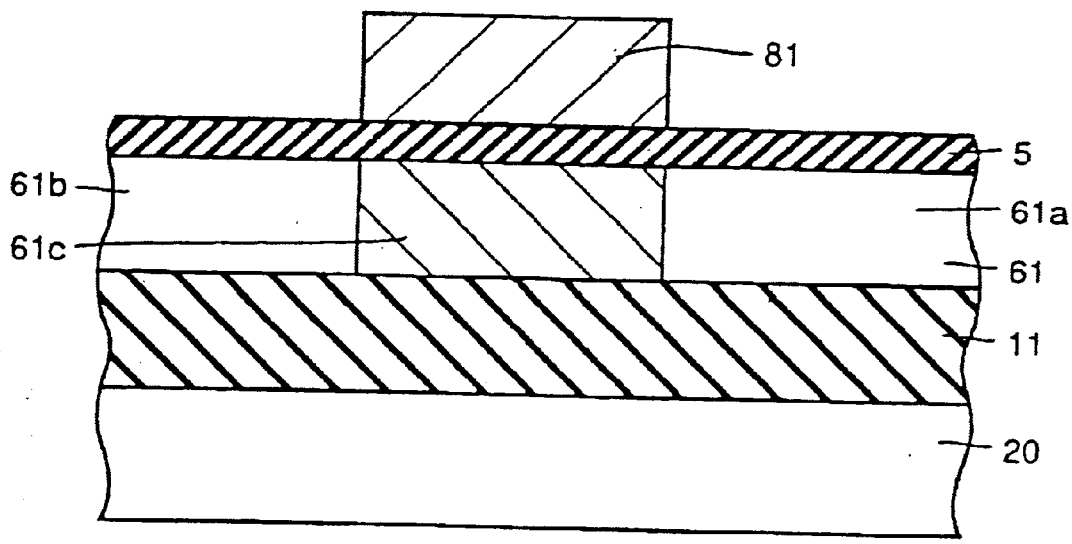
FIG. 43 is a cross sectional view schematically showing the structure of a top gate thin film transistor.

Referring to FIG. 43, impurities introduced to a gate polysilicon film 81 in a top gate thin film transistor are selected to be of the conductivity type opposite to that of the impurities introduced to the source/drain region. For example, if the transistor is a p-channel transistor, n type impurities are chosen. The concentration of the impurities in gate polysilicon film 81 is set to $4.23\times10^{19}$ $cm^{-3}$ or lower. Description will be made below of the state of a p-channel transistor having such gate polysilicon film 81 during its operation.

During on-operation, a negative voltage is applied to gate 81. Since a negative voltage is applied also to a drain 61a, carriers are not depleted at gate polysilicon film 81 and the gate capacitance consists only of the capacitance of gate oxide film 5, so that a high on-current can be obtained.

Figure 44:
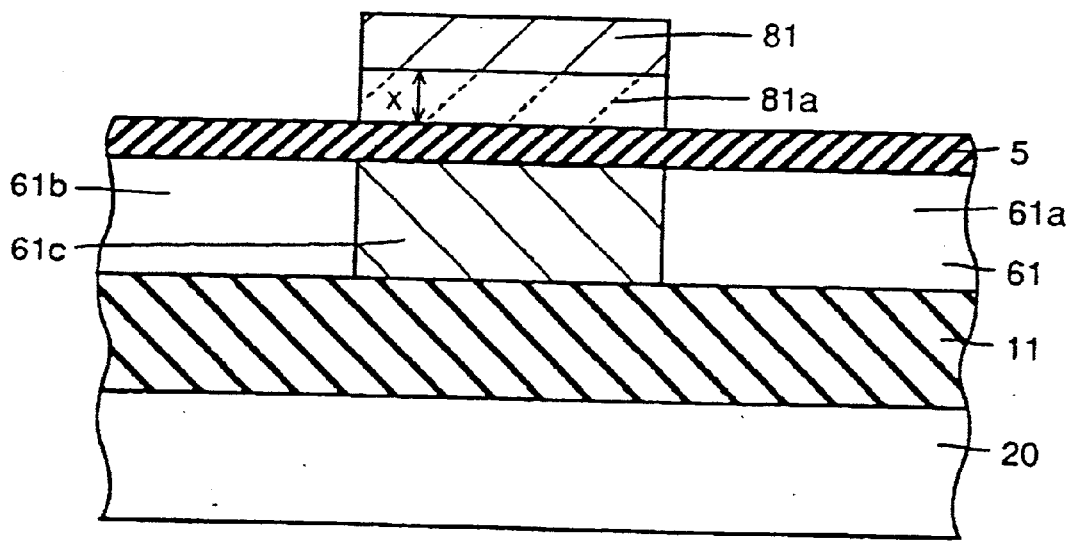
FIG. 44 is a schematic cross sectional view showing formation of a depletion layer at the gate electrode layer when the thin film transistor is off.

By contrast, during off-operation, the gate voltage is equal to 0V and a negative voltage is applied to drain 61a. Since gate 81 has a positive potential difference with drain 61a, carriers or electrons are driven away at the side of n type gate polysilicon film 81 facing drain 61a as shown in FIG. 44, and a depletion layer 81a is formed. The effective gate capacitance in this state is equal to the serially coupled capacitances of the gate oxide film and depletion layer 81a, and therefore the capacitance value declines. As a result, the electric field of the drain end becomes smaller than in the conventional art and an off-current of the transistor can be reduced.

Since the object is to relax the electric field between the gate and the drain by depletion of gate polysilicon film 81, it is defined here that the object is achieved when the electric field is reduced by 10% or more. The relaxation ratio is set to 10% because variation in off-current between transistors is approximately 10%. The following relationship can be obtained in which the width of depletion layer in gate polysilicon 81 is represented as x (FIG. 44), the impurity concentration as N, the voltage drop as Vd:

$$N = 2\epsilon_S Vd/qx^2$$

where $\epsilon_S$ is dielectric constant of silicon ($1.05 \times 10^{-12}$ F/cm$^2$) and q is the amount of elementary electric charges ($1.60 \times 10^{-19}$ C).

Assuming that the voltage between the gate and the drain is represented as Vgd, the drain electric field is relaxed by depletion of the gate if Vd is equal to or greater than 10% of Vgd. This is because Vgd is reduced by voltage Vd applied to depletion layer 81a of gate polysilicon film 81. Here, the reciprocal of capacitance Cd of depletion layer 81a is 10% of the reciprocal of capacitance $C_{OX}$ of gate oxide film 5. Therefore, the equation $x = 0.305 \times t_{OX}$ is established. Thus, N can be obtained as follows from the equations above.

$$N = 2 \times 1.05 \times 10^{-12} \times 0.1 \times Vgd/1.60 \times 10^{-19} \times (0.305 \times t_{OX})^2 = 1.41 \times 10^7 \times (Vgd/t_{OX})$$

Vgd is usually 3V in the memory cell of an SRAM, and if $t_{OX}$ is 10 nm, then N is equal to $4.23 \times 10^{19}$ cm$^{-3}$. Hence, if impurity concentration N of gate polysilicon film 81 is set to $4.23 \times 10^{19}$ cm$^{-3}$ or lower, the electric field of the drain end is relaxed by 10% and decrease in off-current of the transistor becomes meaningful.

In FIG. 3 of N. D. Arora et al., "Modeling the Polysilicon Depletion Effect and Its Impact on Submicrometer CMOS circuit Performance" *IEEE TRANSACTIONS ON ELECTRON DEVICES*, VOL. 42, No. 5, MAY 1995, pp. 935–942, it is described that threshold voltage Vth increases due to depletion from the point where the impurity concentration of the gate polysilicon film is $1 \times 10^{19}$ cm$^{-3}$.

A manufacturing method of the transistor having such structure will be described below.

Referring to FIG. 43, a channel polysilicon film 61 having a thickness of 40 nm and gate oxide film 5 having a thickness of 40 nm are formed by CVD on silicon oxide film 11 which is formed on silicon substrate 20. Next, polysilicon film 81 having no impurities introduced thereto is deposited to have a thickness of 0.1 μm by CVD. Phosphorus ions are implanted to polysilicon 81 by ion implantation method at the implantation energy of 40–60 keV and the dose of $1 \times 10^{13} - 5 \times 10^{14}$ cm$^2$. Annealing is carried out at the temperature of 800° C. and phosphorus is activated. Through such steps, gate polysilicon film 81 having the impurity concentration of $4.23 \times 10^{19}$ cm$^{-3}$ or lower is formed. Thereafter, polysilicon film 81 is processed to have a desired pattern, and the source and drain portions are formed to complete a transistor.

The steps for forming an n-channel transistor are the same as those described above except that boron is implanted to the gate poly.

Embodiment 11

Figure 45:
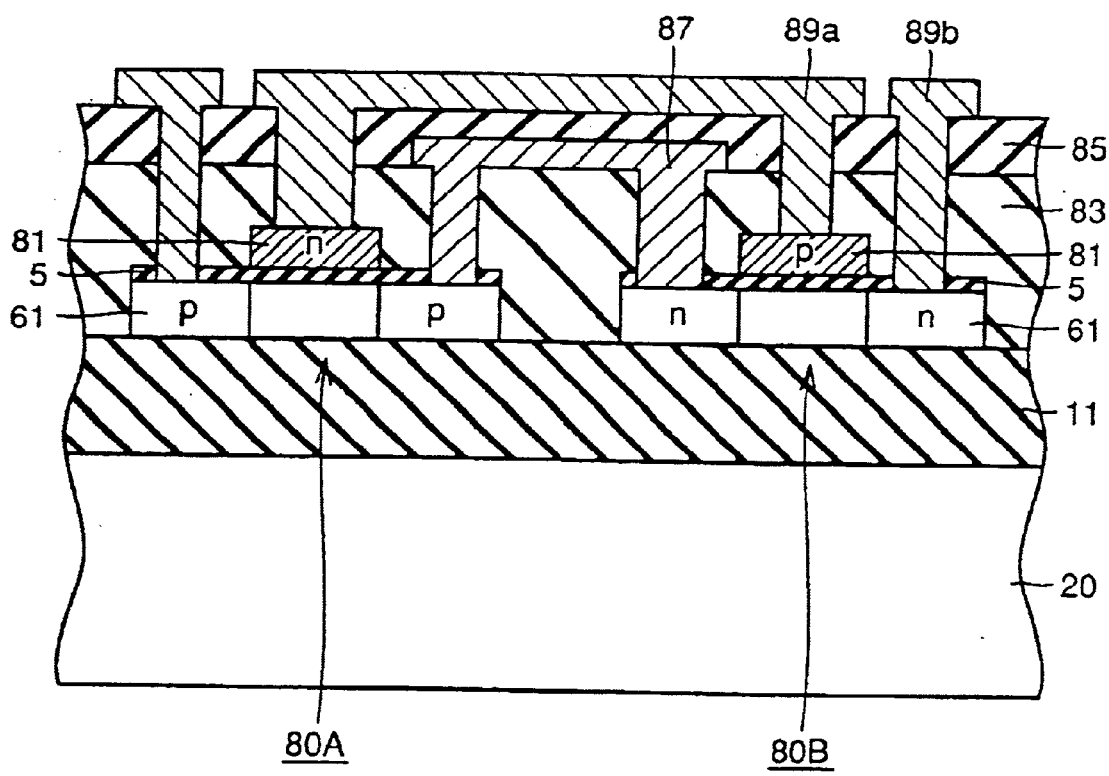
FIGS. 45 and 46 are cross sectional views schematically showing the structures of the thin film transistors according to eleventh and twelfth embodiments of the present invention, respectively.
Figure 46:
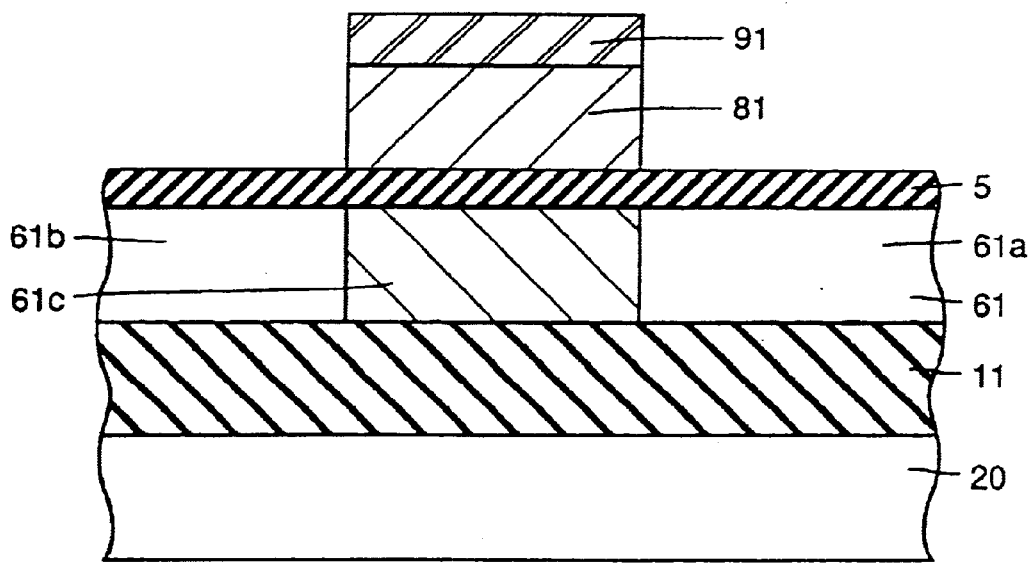

As shown in FIG. 45, a CMOS (Complementary Metal Oxide Semiconductor) circuit can be formed by a p-channel transistor 80A having n type gate polysilicon film 81 with low impurity concentration described in connection with Embodiment 10 and an n-channel transistor 80B having a p type gate polysilicon film 81 with low impurity concentration described in connection with Embodiment 10.

Since gate polysilicon film 81 has low impurity concentration, a CMOS circuit with reduced leakage current can be obtained.

While description is made in connection with a top gate transistor in the tenth and eleventh embodiments above, application can be made also to a bottom gate transistor.

Embodiment 12

Since the gate polysilicon film has low impurity concentration in the tenth and eleventh embodiments above, the gate polysilicon film has high electric resistance.

For the application where such high resistance is disadvantageous, a layer 91 of metal such as W (tungsten), Ti (titanium), and Co (cobalt) or of metal silicide thereof is stacked on top of polysilicon film 81 to form a two-layered gate electrode in order to solve such problem. Since layer 91 of such metal or silicide thereof has low electric resistance, such layer plays a role of reducing the resistance of the gate electrode instead of polysilicon film 81.

As one method of manufacturing such structure, a method can be employed where impurities are implanted to gate polysilicon film 81 in tenth embodiment shown in FIG. 43 and the metal or metal silicide thereof is deposited by sputtering method to have a thickness of 0.1–0.3 μm and processed to obtain the gate electrode pattern.

Embodiment 13

The following method can also be employed for forming the gate polysilicon film with low impurity concentration.

This method utilizes introduction of impurities of opposite types to the source/drain region and the gate electrode. In accordance with this method, impurities are implanted to the gate polysilicon film at the dose equal to the sum of desired impurity concentration and the impurity concentration of the source/drain region.

Figure 47:
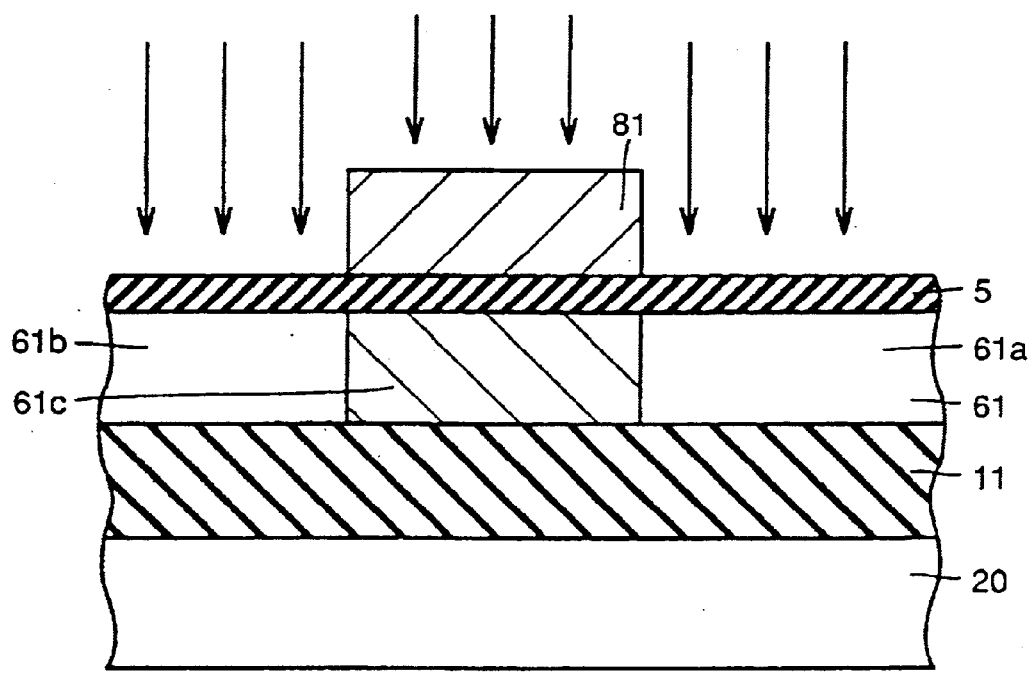
FIG. 47 shows a step of a method of manufacturing a thin film transistor according to a thirteenth embodiment of the present invention.

More specifically, with reference to FIG. 47, phosphorus is implanted to gate polysilicon film 81 at the dose of $1.1 \times 10^{15}$ cm$^{-2}$. Thereafter, boron is implanted at the dose of $1.0 \times 10^{15}$ cm$^{-2}$ for forming source/drain regions 61a and 61b with the surface of gate polysilicon film 81 exposed. As a result, phosphorus of $1.1 \times 10^{15}$ cm$^{-2}$ and boron of $1.0 \times 10^{15}$ cm$^{-2}$ coexist in gate polysilicon film 81. Since they are the impurities of the opposite conductivity types, they compensate for each other, and therefore this is equivalent to implantation of phosphorus of $1.0 \times 10^{14}$ cm$^{-2}$ to gate polysilicon film 81. Thus, the phosphorus dose of $1 \times 10^{14}$ cm$^{-2}$ can be obtained for gate polysilicon film 81 and the boron dose of $1 \times 10^{15}$ cm$^{-2}$ can be obtained for source region 61b and the drain region 61a.

Although it has been necessary to cover the gate with a mask of an oxide film or resist to prevent impurities of the source/drain region from entering the gate in the conventional art, this method eliminates the need for such step.

While the description above relates to a p-channel transistor, the same applies to an n-channel transistor.

The tenth through thirteenth embodiments can be applied to the thin film transistors of the first through fifth embodiments.

In the semiconductor device having a thin film transistor according to one aspect of the present invention, the first and second conductive layers are formed to contact one and the other ends of the semiconductor layer respectively and have a width greater than the semiconductor layer, so that a contact can be stably made by the first and second conductive layers even if the position where a contact hole reaching one and the other ends of the semiconductor layer is formed is shifted due to displacement of the mask.

In the method of manufacturing a semiconductor device having a thin film transistor according to one aspect of the present invention, each portion forming the thin film transistor is formed by vapor deposition, so that the thin film transistor can be formed over the element at the substrate. As a result, a thin film transistor more suitable for high integration can be obtained.

In the method of manufacturing a semiconductor device having a thin film transistor according to another aspect of the present invention, a thin film transistor having a low off-current can be easily manufactured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a thin film transistor, comprising;
    first and second conductive layers provided to be isolated from each other;
    a semiconductor layer having one end placed on top of said first conductive layer and in contact with said first conductive layer, and another end placed on top of said second conductive layer and in contact with said second conductive layer; and
    a gate electrode layer covering an upper surface and opposing side surfaces of said semiconductor layer with a gate insulating layer interposed therebetween at a central portion sandwiched by said one end and said another end; wherein
    a line width defined by said opposing side surfaces of said semiconductor layer is smaller than a thickness of said semiconductor layer, and
    a line width of said first and second conductive layers is greater than said line width of said semiconductor layer.

2. The semiconductor device having a thin film transistor according to claim 1, further comprising a semiconductor substrate having a main surface where an element is formed, and an insulating layer formed on the main surface to cover said element and having a hole, wherein
    said first and second conductive layers are formed on said insulating layer, and wherein
    at least one of said first and second conductive layers is electrically connected to said element through said hole.

3. The semiconductor device having a thin film transistor according to claim 1, wherein said gate electrode layer covers a lower surface of said semiconductor layer.

4. The semiconductor device having a thin film transistor according to claim 1, wherein said gate electrode layer covers said semiconductor layer from an upper end of said side surface to a lower end thereof at said central portion of said semiconductor layer.

5. The semiconductor device having a thin film transistor according to claim 1, wherein at least one kind of impurity selected from the group consisting of fluorine, oxygen and neon, and nitrogen are introduced at least to a portion of said semiconductor layer covered with said gate electrode layer.

6. The semiconductor device having a thin film transistor according to claim 1, wherein said gate insulating layer has a silicon oxynitride ($SiO_xN_{1-x}$) film.

7. The semiconductor device having a thin film transistor according to claim 1, wherein nitrogen is introduced to a surface of said gate electrode layer facing said semiconductor layer and to said gate insulating layer.

8. The semiconductor device having a thin film transistor according to claim 1, wherein
    the conductivity type of impurity introduced to said first and second conductive layers is different from the conductivity type of impurity introduced to said gate electrode, and
    concentration of said impurity introduced to said gate electrode layer is at most $4.23 \times 10^{19}$ cm$^{-3}$.

9. The semiconductor device having a thin film transistor according to claim 1, wherein said semiconductor layer and said first and second conductive layers each include impurity of the same conductivity type and concentration of the impurity introduced to said one end and said another end is lower than concentration of the impurity introduced to said first and second conductive layers.

10. A semiconductor device having a thin film transistor, comprising:
    a semiconductor layer having a surface and a pair of source/drain regions spaced apart from each other to define a channel region; and
    a gate electrode layer facing said channel region of said semiconductor layer with a gate insulating layer interposed therebetween; wherein
    the conductivity type of impurity introduced to said source/drain regions of said semiconductor layer is different from the conductivity type of impurity introduced to said gate electrode layer, and
    concentration of said impurity introduced to said gate electrode layer is at most $4.23 \times 10^{19}$ cm$^{-3}$; wherein:
    the source/drdain regions have p type conductivity;
    the gate electrode layer has n type conductivity;
    gate electrode layer is formed only by a single layer region of different conductivity from said source/drain regions and, as a whole, has a uniform impurity concentration; and
    during off-operation, a depletion layer is formed from the side of the channel region in the gate electrode.

11. A semiconductor device having a thin film transistor, comprising:
    first and second conductive layers provided to be isolated from each other;
    a semiconductor layer having one end placed on top of said first conductive layer and in contact with said first conductive layer, and another end placed on top of said second conductive layer and in contact with said second conductive layer; and
    a gate electrode layer covering an upper surface and opposing side surfaces of said semiconductor layer with a gate insulating layer interposed therebetween at a central portion sandwiched by said one end and said another end; wherein a line width defined by said opposing side surface of said semiconductor layer is smaller than a thickness of said semiconductor layer.

12. The semiconductor device having a thin film transistor according to claim 11, further comprising a semiconductor substrate having a main surface where an element is formed, and an insulating layer formed on the main surface to cover said element and having a hold, wherein said first and second conductive layers are formed on said insulating layer, and wherein at least one of said first and second conductive layers is electrically connected to said element through said hole.

13. The semiconductor device having a thin film transistor according to claim 11 wherein said gate electrode layer covers a lower surface of said semiconductor layer.

14. The semiconductor device having a thin film transistor according to claim 11 wherein said gate electrode layer covers said semiconductor layer from an upper end of said side surface to a lower end thereof at said central portion of said semiconductor layer.

15. A semiconductor device having a thin film transistor, comprising:

a semiconductor layer having a surface and a pair of source/drain regions spaced apart from each other to define a channel region; and a gate electrode layer facing said channel region of said semiconductor layer with a gate insulating layer interposed therebetween; wherein:

said gate electrode layer is formed below said semiconductor layer;

said pair of source/drain regions and said gate electrode constitute a thin film transistor;

nitrogen is introduced to a surface of said gate electrode layer facing said channel region and to said gate insulating layer forming a nitrogen concentration distribution having a peak at an interface between the gate electrode layer and the gate insulating layer, and within the gate electrode layer, having a highest concentration at a portion in contact with said gate insulating layer.

* * * * *